(12) United States Patent
Narwankar et al.

(10) Patent No.: US 8,119,210 B2
(45) Date of Patent: Feb. 21, 2012

(54) FORMATION OF A SILICON OXYNITRIDE LAYER ON A HIGH-K DIELECTRIC MATERIAL

(75) Inventors: Pravin K. Narwankar, Sunnyvale, CA (US); Gregg Higashi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1281 days.

(21) Appl. No.: 10/851,561

(22) Filed: May 21, 2004

(65) Prior Publication Data

US 2005/0260347 A1 Nov. 24, 2005

(51) Int. Cl.
*H05H 1/24* (2006.01)
(52) U.S. Cl. .......................................... 427/569
(58) Field of Classification Search .................. 427/569
See application file for complete search history.

(56) References Cited

U.S. PATENT DOCUMENTS

| | | |
|---|---|---|
| 3,427,514 A | 2/1969 | Olmstead et al. |
| 3,594,295 A | 7/1971 | Meckel et al. |
| 4,043,848 A | 8/1977 | Bazin et al. |
| 4,058,430 A | 11/1977 | Suntola et al. |
| 4,096,509 A | 6/1978 | Blaha et al. |
| 4,262,631 A | 4/1981 | Kubacki |
| 4,310,380 A | 1/1982 | Flamm et al. |
| 4,335,391 A | 6/1982 | Morris |
| 4,389,973 A | 6/1983 | Suntola et al. |
| 4,412,119 A | 10/1983 | Komatsu et al. |
| 4,413,022 A | 11/1983 | Suntola et al. |
| 4,415,275 A | 11/1983 | Dietrich |
| 4,439,463 A | 3/1984 | Miller |
| 4,459,739 A | 7/1984 | Shepherd et al. |
| 4,495,219 A | 1/1985 | Kato et al. |
| 4,534,826 A | 8/1985 | Goth et al. |
| 4,545,112 A | 10/1985 | Holmberg et al. |
| 4,563,367 A | 1/1986 | Sherman |
| 4,585,516 A | 4/1986 | Corn et al. |
| 4,605,947 A | 8/1986 | Price et al. |

(Continued)

FOREIGN PATENT DOCUMENTS

EP 0232619 8/1987

(Continued)

OTHER PUBLICATIONS

Wilk, GD, et al. "High-k gate dielectrics: Current status and materials properties considerations" App. Phys. Rev. 89(10) May 2001 pp. 5243-5275.*

(Continued)

*Primary Examiner* — Kelly M Gambetta
(74) *Attorney, Agent, or Firm* — Patterson & Sheridan, L.L.P.

(57) ABSTRACT

In one embodiment, a method for depositing a capping layer on a dielectric layer in a process chamber is provided which includes depositing the dielectric layer on a substrate surface, depositing a silicon-containing layer by an ALD process, comprising alternately pulsing a silicon precursor and an oxidizing gas into the process chamber, and exposing the silicon-containing layer to a nitridation process. In another embodiment, a method for depositing a silicon-containing capping layer on a dielectric layer in a process chamber by an ALD process is provided which includes flowing a silicon precursor into the process chamber, purging the process chamber with a purge gas, flowing an oxidizing gas comprising water formed by flowing a $H_2$ gas and an oxygen-containing gas through a water vapor generator, and purging the process chamber with the purge gas.

45 Claims, 4 Drawing Sheets

U.S. PATENT DOCUMENTS

| | | | |
|---|---|---|---|
| 4,608,063 A | 8/1986 | Kurokawa et al. | |
| 4,651,185 A | 3/1987 | Holmberg et al. | |
| 4,693,208 A | 9/1987 | Sakai | |
| 4,700,458 A | 10/1987 | Suzuki et al. | |
| 4,725,560 A | 2/1988 | Abernathey et al. | |
| 4,743,953 A | 5/1988 | Toyokura et al. | |
| 4,745,082 A | 5/1988 | Kwok | |
| 4,761,269 A | 8/1988 | Conger et al. | |
| 4,834,831 A | 5/1989 | Nishizawa et al. | |
| 4,851,370 A | 7/1989 | Doklan et al. | |
| 4,913,929 A | 4/1990 | Moslehi et al. | |
| 4,948,458 A | 8/1990 | Ogle | |
| 4,975,252 A | 12/1990 | Nishizawa et al. | |
| 4,980,307 A | 12/1990 | Ito et al. | |
| 4,993,357 A | 2/1991 | Scholz | |
| 5,000,113 A | 3/1991 | Wang et al. | |
| 5,027,746 A | 7/1991 | Frijlink et al. | |
| 5,063,431 A | 11/1991 | Ohshima et al. | |
| 5,173,327 A | 12/1992 | Sandhu et al. | |
| 5,173,442 A | 12/1992 | Carey | |
| 5,178,681 A | 1/1993 | Moore et al. | |
| 5,225,366 A | 7/1993 | Yoder | |
| 5,228,950 A | 7/1993 | Webb et al. | |
| 5,261,959 A | 11/1993 | Gasworth | |
| 5,281,274 A | 1/1994 | Yoder | |
| 5,290,609 A | 3/1994 | Horiike et al. | |
| 5,292,673 A | 3/1994 | Shinriki et al. | |
| 5,294,286 A | 3/1994 | Nishizawa et al. | |
| 5,302,236 A | 4/1994 | Tahara et al. | |
| 5,314,724 A | 5/1994 | Tsukune et al. | |
| 5,335,138 A | 8/1994 | Sandhu et al. | |
| 5,338,362 A | 8/1994 | Imahashi | |
| 5,374,570 A | 12/1994 | Nasu et al. | |
| 5,391,510 A | 2/1995 | Hsu et al. | |
| 5,441,703 A | 8/1995 | Jurgensen | |
| 5,443,647 A | 8/1995 | Aucoin et al. | |
| 5,464,783 A | 11/1995 | Kim et al. | |
| 5,480,818 A | 1/1996 | Matsumoto et al. | |
| 5,483,919 A | 1/1996 | Yokoyama et al. | |
| 5,503,875 A | 4/1996 | Imai et al. | |
| 5,521,126 A | 5/1996 | Okamura et al. | |
| 5,582,866 A | 12/1996 | White | |
| 5,619,051 A | 4/1997 | Endo et al. | |
| 5,674,786 A | 10/1997 | Turner et al. | |
| 5,711,811 A | 1/1998 | Suntola et al. | |
| 5,726,087 A | 3/1998 | Tseng et al. | |
| 5,730,802 A | 3/1998 | Ishizumi et al. | |
| 5,763,922 A | 6/1998 | Chau | |
| 5,796,116 A | 8/1998 | Nakata et al. | |
| 5,807,792 A | 9/1998 | Ilg et al. | |
| 5,834,343 A | 11/1998 | Ogasawara et al. | |
| 5,835,677 A | 11/1998 | Li et al. | |
| 5,840,626 A | 11/1998 | Ohguro et al. | |
| 5,851,602 A | 12/1998 | Law et al. | |
| 5,855,680 A | 1/1999 | Soininen et al. | |
| 5,861,197 A | 1/1999 | Law et al. | |
| 5,865,896 A | 2/1999 | Nowak et al. | |
| 5,874,766 A | 2/1999 | Hori et al. | |
| 5,879,459 A | 3/1999 | Gadgli et al. | |
| 5,880,508 A | 3/1999 | Wu et al. | |
| 5,891,798 A | 4/1999 | Doyle et al. | |
| 5,916,365 A | 6/1999 | Sherman | |
| 5,928,732 A | 7/1999 | Law et al. | |
| 5,935,373 A | 8/1999 | Koshimizu et al. | |
| 5,937,303 A | 8/1999 | Gardner et al. | |
| 5,960,270 A | 9/1999 | Misra et al. | |
| 5,972,430 A | 10/1999 | DiMeo, Jr. et al. | |
| 5,976,993 A | 11/1999 | Ravi et al. | |
| 6,008,095 A | 12/1999 | Gardner et al. | |
| 6,013,553 A | 1/2000 | Wallace et al. | |
| 6,015,590 A | 1/2000 | Suntola et al. | |
| 6,020,024 A | 2/2000 | Maiti et al. | |
| 6,020,243 A | 2/2000 | Wallace et al. | |
| 6,023,613 A | 2/2000 | Kanehara et al. | |
| 6,025,627 A | 2/2000 | Forbes et al. | |
| 6,027,961 A | 2/2000 | Maiti et al. | |
| 6,033,963 A | 3/2000 | Huang et al. | |
| 6,041,734 A | 3/2000 | Raoux et al. | |
| 6,042,652 A | 3/2000 | Hyun et al. | |
| 6,043,157 A | 3/2000 | Gardner et al. | |
| 6,049,114 A | 4/2000 | Maiti et al. | |
| 6,054,013 A | 4/2000 | Collins et al. | |
| 6,060,755 A | 5/2000 | Ma et al. | |
| 6,063,704 A | 5/2000 | Demirlioglu | |
| 6,066,533 A | 5/2000 | Yu | |
| 6,071,572 A | 6/2000 | Mosely et al. | |
| 6,077,403 A | 6/2000 | Kobayashi et al. | |
| 6,083,836 A | 7/2000 | Rodder | |
| 6,087,231 A | 7/2000 | Xiang et al. | |
| 6,090,653 A | 7/2000 | Wu et al. | |
| 6,093,590 A | 7/2000 | Lou et al. | |
| 6,110,287 A | 8/2000 | Arai et al. | |
| 6,117,279 A | 9/2000 | Smolanoff et al. | |
| 6,124,158 A | 9/2000 | Dautartas et al. | |
| 6,130,123 A | 10/2000 | Liang et al. | |
| 6,136,654 A | 10/2000 | Kraft et al. | |
| 6,139,700 A | 10/2000 | Kang et al. | |
| 6,140,024 A | 10/2000 | Misium et al. | |
| 6,140,688 A | 10/2000 | Gardner et al. | |
| 6,144,060 A | 11/2000 | Park et al. | |
| 6,162,709 A | 12/2000 | Raoux et al. | |
| 6,171,900 B1 | 1/2001 | Sun | |
| 6,171,910 B1 | 1/2001 | Hobbs et al. | |
| 6,174,377 B1 | 1/2001 | Doering et al. | |
| 6,174,809 B1 | 1/2001 | Kang et al. | |
| 6,183,563 B1 | 2/2001 | Choi et al. | |
| 6,184,072 B1 | 2/2001 | Kaushik et al. | |
| 6,184,114 B1 | 2/2001 | Lukanc | |
| 6,190,513 B1 | 2/2001 | Forster et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,304 B1 | 3/2001 | Law et al. | |
| 6,207,487 B1 | 3/2001 | Kim et al. | |
| 6,228,229 B1 | 5/2001 | Raaijmakers et al. | |
| 6,231,672 B1 | 5/2001 | Choi et al. | |
| 6,235,650 B1 | 5/2001 | Yao et al. | |
| 6,238,734 B1 | 5/2001 | Senzaki et al. | |
| 6,244,211 B1 | 6/2001 | Nishikawa et al. | |
| 6,254,738 B1 | 7/2001 | Stimson et al. | |
| 6,254,746 B1 | 7/2001 | Subramani et al. | |
| 6,255,231 B1 | 7/2001 | Chen et al. | |
| 6,255,698 B1 | 7/2001 | Gardner et al. | |
| 6,258,675 B1 | 7/2001 | Gardner et al. | |
| 6,264,812 B1 | 7/2001 | Raaijmakers et al. | |
| 6,270,572 B1 | 8/2001 | Kim et al. | |
| 6,277,253 B1 | 8/2001 | Narasimhan et al. | |
| 6,284,646 B1 | 9/2001 | Leem | |
| 6,287,635 B1 | 9/2001 | Cook et al. | |
| 6,287,965 B1 | 9/2001 | Kang et al. | |
| 6,291,282 B1 | 9/2001 | Wilk et al. | |
| 6,291,283 B1 | 9/2001 | Wilk | |
| 6,291,867 B1 | 9/2001 | Wallace et al. | |
| 6,297,107 B1 | 10/2001 | Paton et al. | |
| 6,297,172 B1 * | 10/2001 | Kashiwagi ..................... 438/773 |
| 6,297,539 B1 | 10/2001 | Ma et al. | |
| 6,297,595 B1 | 10/2001 | Stimson et al. | |
| 6,299,294 B1 | 10/2001 | Regan | |
| 6,302,965 B1 | 10/2001 | Umotoy et al. | |
| 6,303,481 B2 | 10/2001 | Park et al. | |
| 6,305,314 B1 | 10/2001 | Sneh et al. | |
| 6,306,216 B1 | 10/2001 | Kim et al. | |
| 6,320,238 B1 | 11/2001 | Kizilyalli et al. | |
| 6,342,277 B1 | 1/2002 | Sherman | |
| 6,344,419 B1 | 2/2002 | Forster et al. | |
| 6,345,588 B1 | 2/2002 | Stimson | |
| 6,346,465 B1 | 2/2002 | Miura et al. | |
| 6,348,126 B1 | 2/2002 | Hanawa et al. | |
| 6,348,386 B1 | 2/2002 | Gilmer | |
| 6,352,594 B2 | 3/2002 | Cook et al. | |
| 6,354,593 B1 | 3/2002 | Frommer et al. | |
| 6,355,108 B1 | 3/2002 | Won et al. | |
| 6,358,810 B1 | 3/2002 | Dornfest et al. | |
| 6,361,667 B1 | 3/2002 | Kobayashi et al. | |
| 6,365,450 B1 | 4/2002 | Kim | |
| 6,365,518 B1 | 4/2002 | Lee et al. | |
| 6,372,598 B2 | 4/2002 | Kang et al. | |

| | | |
|---|---|---|
| 6,373,111 B1 | 4/2002 | Zheng et al. |
| 6,376,807 B1 | 4/2002 | Hong et al. |
| 6,391,785 B1 | 5/2002 | Satta et al. |
| 6,391,803 B1 | 5/2002 | Kim et al. |
| 6,395,650 B1 | 5/2002 | Callegari et al. |
| 6,399,208 B1 | 6/2002 | Baum et al. |
| 6,399,491 B2 | 6/2002 | Jeon et al. |
| 6,399,520 B1 | 6/2002 | Kawakami et al. |
| 6,413,382 B1 | 7/2002 | Wang et al. |
| 6,416,577 B1 | 7/2002 | Suntoloa et al. |
| 6,420,279 B1 | 7/2002 | Ono et al. |
| 6,436,801 B1 | 8/2002 | Wilk et al. |
| 6,444,099 B1 | 9/2002 | Sasaki et al. |
| 6,444,592 B1 | 9/2002 | Ballantine et al. |
| 6,447,607 B2 | 9/2002 | Soininen et al. |
| 6,447,636 B1 | 9/2002 | Qian et al. |
| 6,448,166 B2 | 9/2002 | Cho et al. |
| 6,451,119 B2 | 9/2002 | Sneh et al. |
| 6,451,695 B2 | 9/2002 | Sneh |
| 6,452,229 B1 | 9/2002 | Krivokapic |
| 6,461,483 B1 | 10/2002 | Gopalraja et al. |
| 6,462,367 B2 | 10/2002 | Marsh et al. |
| 6,468,924 B2 | 10/2002 | Lee et al. |
| 6,472,337 B1 | 10/2002 | Zhuang et al. |
| 6,475,276 B1 | 11/2002 | Elers et al. |
| 6,475,854 B2 | 11/2002 | Narwankar et al. |
| 6,475,908 B1 | 11/2002 | Lin et al. |
| 6,475,910 B1 | 11/2002 | Sneh |
| 6,477,980 B1 | 11/2002 | White et al. |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,752 B1 | 11/2002 | Yamazaki et al. |
| 6,486,080 B2 | 11/2002 | Chooi et al. |
| 6,492,283 B2 | 12/2002 | Raaijmakers et al. |
| 6,497,796 B1 | 12/2002 | Ashtiani et al. |
| 6,500,742 B1 | 12/2002 | Chern et al. |
| 6,504,214 B1 | 1/2003 | Yu et al. |
| 6,506,287 B1 | 1/2003 | Ding |
| 6,506,676 B2 | 1/2003 | Park et al. |
| 6,511,539 B1 | 1/2003 | Raaijmakers |
| 6,511,875 B2 | 1/2003 | Park et al. |
| 6,514,828 B2 | 2/2003 | Ahn et al. |
| 6,528,856 B1 | 3/2003 | Bai et al. |
| 6,528,858 B1 | 3/2003 | Yu et al. |
| 6,534,395 B2 | 3/2003 | Werkhoven et al. |
| 6,541,079 B1 | 4/2003 | Bojarczuk, Jr. et al. |
| 6,544,906 B2 | 4/2003 | Rotondaro et al. |
| 6,548,366 B2 | 4/2003 | Niimi et al. |
| 6,548,368 B1 | 4/2003 | Narwankar et al. |
| 6,551,406 B2 | 4/2003 | Kilpi |
| 6,551,446 B1 | 4/2003 | Hanawa et al. |
| 6,554,979 B2 | 4/2003 | Stimson |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,599,572 B2 | 7/2003 | Saanila et al. |
| 6,607,973 B1 | 8/2003 | Jeon |
| 6,610,374 B2 | 8/2003 | Tsai et al. |
| 6,610,615 B1 | 8/2003 | McFadden et al. |
| 6,617,209 B1 | 9/2003 | Chau et al. |
| 6,617,266 B2 | 9/2003 | Nickles et al. |
| 6,620,670 B2 | 9/2003 | Song et al. |
| 6,620,723 B1 | 9/2003 | Byun et al. |
| 6,630,030 B1 | 10/2003 | Suntola et al. |
| 6,630,201 B2 | 10/2003 | Chiang et al. |
| 6,630,413 B2 | 10/2003 | Todd |
| 6,632,279 B1 | 10/2003 | Ritala et al. |
| 6,632,747 B2 | 10/2003 | Niimi et al. |
| 6,638,877 B2 | 10/2003 | Rotondaro |
| 6,641,703 B2 | 11/2003 | Nomura et al. |
| 6,649,538 B1 | 11/2003 | Cheng et al. |
| 6,652,924 B2 | 11/2003 | Sherman |
| 6,653,698 B2 | 11/2003 | Lee et al. |
| 6,660,126 B2 | 12/2003 | Nguyen et al. |
| 6,660,134 B1 | 12/2003 | Gopalraja et al. |
| 6,660,659 B1 | 12/2003 | Kraus et al. |
| 6,660,660 B2 | 12/2003 | Haukka et al. |
| 6,661,058 B2 | 12/2003 | Ahn et al. |
| 6,664,160 B2 | 12/2003 | Park et al. |
| 6,673,724 B2 | 1/2004 | Forster et al. |
| 6,674,138 B1 | 1/2004 | Halliyal et al. |
| 6,675,816 B2 | 1/2004 | Ichijo et al. |
| 6,677,254 B2 | 1/2004 | Narwankar et al. |
| 6,682,973 B1 | 1/2004 | Paton et al. |
| 6,689,646 B1 | 2/2004 | Joshi et al. |
| 6,716,287 B1 | 4/2004 | Santiago et al. |
| 6,718,126 B2 | 4/2004 | Lei |
| 6,719,883 B2 | 4/2004 | Stimson |
| 6,734,020 B2 | 5/2004 | Lu et al. |
| 6,743,473 B1 | 6/2004 | Parkhe et al. |
| 6,759,286 B2 | 7/2004 | Kumar et al. |
| 6,765,178 B2 | 7/2004 | Shang et al. |
| 6,767,824 B2 | 7/2004 | Nallan et al. |
| 6,772,072 B2 | 8/2004 | Ganguli et al. |
| 6,773,507 B2 | 8/2004 | Jallepally et al. |
| 6,777,346 B2 | 8/2004 | Iyer |
| 6,777,352 B2 | 8/2004 | Tepman et al. |
| 6,778,762 B1 | 8/2004 | Shareef et al. |
| 6,780,720 B2 | 8/2004 | Burnham et al. |
| 6,784,033 B1 | 8/2004 | Yamazaki et al. |
| 6,790,755 B2 | 9/2004 | Jeon |
| 6,803,272 B1 | 10/2004 | Halliyal et al. |
| 6,806,095 B2 | 10/2004 | Nallan et al. |
| 6,806,653 B2 | 10/2004 | Strang et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,821,873 B2 | 11/2004 | Visokay et al. |
| 6,824,658 B2 | 11/2004 | Gopalraja et al. |
| 6,831,021 B2 | 12/2004 | Chua et al. |
| 6,841,439 B1 | 1/2005 | Anthony et al. |
| 6,846,516 B2 | 1/2005 | Yang et al. |
| 6,855,643 B2 | 2/2005 | Nallan et al. |
| 6,858,547 B2 | 2/2005 | Metzner et al. |
| 6,864,145 B2 | 3/2005 | Hareland et al. |
| 6,866,746 B2 | 3/2005 | Lei et al. |
| 6,868,859 B2 | 3/2005 | Yudovsky |
| 6,881,437 B2 | 4/2005 | Ivanov et al. |
| 6,902,624 B2 | 6/2005 | Seidel et al. |
| 6,902,681 B2 | 6/2005 | Nallan et al. |
| 6,911,399 B2 | 6/2005 | Liu et al. |
| 6,919,251 B2 | 7/2005 | Rotondaro et al. |
| 6,921,062 B2 | 7/2005 | Gregg et al. |
| 6,924,191 B2 | 8/2005 | Liu et al. |
| 6,946,408 B2 | 9/2005 | Le et al. |
| 6,960,537 B2 | 11/2005 | Shero et al. |
| 6,982,230 B2 | 1/2006 | Cabral, Jr. et al. |
| 6,998,357 B2 | 2/2006 | Bai et al. |
| 7,023,064 B2 | 4/2006 | Park et al. |
| 7,064,066 B1 | 6/2006 | Metz et al. |
| 7,067,439 B2 | 6/2006 | Metzner et al. |
| 7,084,024 B2 | 8/2006 | Gluschenkov et al. |
| 7,094,613 B2 | 8/2006 | Mui et al. |
| 7,094,704 B2 | 8/2006 | Jin et al. |
| 7,105,889 B2 | 9/2006 | Bojarczuk, Jr. et al. |
| 7,122,454 B2 | 10/2006 | Olsen |
| 7,175,713 B2 | 2/2007 | Thakur et al. |
| 7,179,754 B2 | 2/2007 | Kraus et al. |
| 7,208,361 B2 | 4/2007 | Shah et al. |
| 7,217,611 B2 | 5/2007 | Kavalieros et al. |
| 7,217,665 B2 | 5/2007 | Nallan et al. |
| 7,220,635 B2 | 5/2007 | Brask et al. |
| 7,235,501 B2 | 6/2007 | Ahn et al. |
| 7,242,055 B2 | 7/2007 | Bojarczuk, Jr. et al. |
| 7,279,413 B2 | 10/2007 | Park et al. |
| 7,294,581 B2 | 11/2007 | Iyer et al. |
| 7,304,004 B2 | 12/2007 | Metzner et al. |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0021589 A1 | 9/2001 | Wilk |
| 2001/0024387 A1 | 9/2001 | Raaijmakers et al. |

| Publication No. | Date | Inventor |
|---|---|---|
| 2001/0024871 A1 | 9/2001 | Yagi |
| 2001/0028924 A1 | 10/2001 | Sherman |
| 2001/0029092 A1 | 10/2001 | Park et al. |
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0042523 A1 | 11/2001 | Kesala |
| 2001/0042799 A1 | 11/2001 | Kim et al. |
| 2001/0049186 A1 | 12/2001 | Ibok |
| 2001/0054377 A1 | 12/2001 | Lindfors et al. |
| 2001/0055889 A1 | 12/2001 | Iyer |
| 2002/0000196 A1 | 1/2002 | Park |
| 2002/0000598 A1 | 1/2002 | Kang et al. |
| 2002/0005556 A1 | 1/2002 | Cartier et al. |
| 2002/0007790 A1 | 1/2002 | Park |
| 2002/0008297 A1 | 1/2002 | Park et al. |
| 2002/0009544 A1 | 1/2002 | McFeely et al. |
| 2002/0009896 A1 | 1/2002 | Sandhu et al. |
| 2002/0014647 A1 | 2/2002 | Seidl et al. |
| 2002/0015790 A1 | 2/2002 | Baum et al. |
| 2002/0016084 A1 | 2/2002 | Todd |
| 2002/0017242 A1 | 2/2002 | Hamaguchi et al. |
| 2002/0023900 A1 | 2/2002 | Mahawili |
| 2002/0029092 A1 | 3/2002 | Gass |
| 2002/0031618 A1 | 3/2002 | Sherman |
| 2002/0041931 A1 | 4/2002 | Suntola et al. |
| 2002/0043666 A1 | 4/2002 | Parsons et al. |
| 2002/0047151 A1 | 4/2002 | Kim et al. |
| 2002/0052097 A1 | 5/2002 | Park |
| 2002/0064970 A1 | 5/2002 | Chooi et al. |
| 2002/0066411 A1 | 6/2002 | Chiang et al. |
| 2002/0066537 A1 | 6/2002 | Ogino et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086106 A1 | 7/2002 | Park et al. |
| 2002/0086111 A1 | 7/2002 | Byun et al. |
| 2002/0092471 A1 | 7/2002 | Kang et al. |
| 2002/0093046 A1 | 7/2002 | Moriya et al. |
| 2002/0093781 A1 | 7/2002 | Bachhofer et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0108570 A1 | 8/2002 | Lindfors et al. |
| 2002/0110991 A1 | 8/2002 | Li |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Lu et al. |
| 2002/0127745 A1 | 9/2002 | Lu et al. |
| 2002/0134307 A1 | 9/2002 | Choi |
| 2002/0142624 A1 | 10/2002 | Levy et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0146895 A1 | 10/2002 | Ramdani et al. |
| 2002/0151152 A1 | 10/2002 | Shimamoto et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0172768 A1 | 11/2002 | Endo et al. |
| 2002/0175393 A1 | 11/2002 | Baum et al. |
| 2002/0177282 A1 | 11/2002 | Song |
| 2002/0177293 A1 | 11/2002 | Wilk et al. |
| 2002/0180028 A1 | 12/2002 | Borovik et al. |
| 2002/0182320 A1 | 12/2002 | Leskela et al. |
| 2002/0187256 A1 | 12/2002 | Elers et al. |
| 2002/0195643 A1 | 12/2002 | Harada |
| 2002/0197881 A1 | 12/2002 | Ramdani et al. |
| 2002/0197883 A1 | 12/2002 | Niimi et al. |
| 2003/0004723 A1 | 1/2003 | Chihara |
| 2003/0010451 A1 | 1/2003 | Tzu et al. |
| 2003/0013320 A1 | 1/2003 | Kim et al. |
| 2003/0015764 A1 | 1/2003 | Raaijmkers et al. |
| 2003/0017697 A1 | 1/2003 | Choi et al. |
| 2003/0022338 A1 | 1/2003 | Ruben et al. |
| 2003/0027392 A1 | 2/2003 | Gousev et al. |
| 2003/0031807 A1 | 2/2003 | Elers et al. |
| 2003/0032281 A1 | 2/2003 | Werkhoven et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0057527 A1 | 3/2003 | Chung et al. |
| 2003/0060057 A1 | 3/2003 | Raaijmakers et al. |
| 2003/0068437 A1 | 4/2003 | Nakamura et al. |
| 2003/0072884 A1 | 4/2003 | Zhang et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082301 A1 | 5/2003 | Chen et al. |
| 2003/0089308 A1 | 5/2003 | Raaijmakers |
| 2003/0089942 A1 | 5/2003 | Bhattacharyya |
| 2003/0096473 A1 | 5/2003 | Shih et al. |
| 2003/0101927 A1 | 6/2003 | Raaijmakers |
| 2003/0101938 A1 | 6/2003 | Ronsse et al. |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0113187 A1 | 6/2003 | Lei et al. |
| 2003/0116804 A1 | 6/2003 | Visokay et al. |
| 2003/0121469 A1 | 7/2003 | Lindfors et al. |
| 2003/0121608 A1 | 7/2003 | Chen et al. |
| 2003/0121886 A1 | 7/2003 | Strang et al. |
| 2003/0124262 A1 | 7/2003 | Chen et al. |
| 2003/0129826 A1 | 7/2003 | Werkhoven et al. |
| 2003/0133861 A1 | 7/2003 | Bowen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143841 A1 | 7/2003 | Yang et al. |
| 2003/0160277 A1 | 8/2003 | Bhattacharyya |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0181012 A1 | 9/2003 | Wang et al. |
| 2003/0185980 A1 | 10/2003 | Endo |
| 2003/0186495 A1 | 10/2003 | Saanila et al. |
| 2003/0186561 A1 | 10/2003 | Law et al. |
| 2003/0188682 A1 | 10/2003 | Tois et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0194493 A1 | 10/2003 | Chang et al. |
| 2003/0194853 A1 | 10/2003 | Jeon |
| 2003/0198754 A1 | 10/2003 | Xi et al. |
| 2003/0205729 A1 | 11/2003 | Basceri et al. |
| 2003/0205772 A1 | 11/2003 | Schaeffer et al. |
| 2003/0213560 A1 | 11/2003 | Wang et al. |
| 2003/0213987 A1 | 11/2003 | Basceri et al. |
| 2003/0215570 A1 | 11/2003 | Seutter et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0227033 A1 | 12/2003 | Ahn et al. |
| 2003/0230549 A1 | 12/2003 | Buchanan et al. |
| 2003/0232491 A1 | 12/2003 | Yamaguchi |
| 2003/0232501 A1 | 12/2003 | Kher et al. |
| 2003/0232506 A1 | 12/2003 | Metzner et al. |
| 2003/0232511 A1 | 12/2003 | Metzner et al. |
| 2003/0232554 A1 | 12/2003 | Blum et al. |
| 2003/0234417 A1 | 12/2003 | Raaijmakers et al. |
| 2003/0235961 A1 | 12/2003 | Metzner et al. |
| 2004/0005749 A1 | 1/2004 | Choi et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |

| Publication No. | Date | Inventor |
|---|---|---|
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0016973 A1 | 1/2004 | Rotondaro et al. |
| 2004/0018723 A1 | 1/2004 | Byun et al. |
| 2004/0018747 A1 | 1/2004 | Lee et al. |
| 2004/0023461 A1 | 2/2004 | Ahn et al. |
| 2004/0023462 A1 | 2/2004 | Rotondaro et al. |
| 2004/0025370 A1 | 2/2004 | Guenther et al. |
| 2004/0028952 A1 | 2/2004 | Cartier et al. |
| 2004/0029321 A1 | 2/2004 | Ang et al. |
| 2004/0033698 A1 | 2/2004 | Lee et al. |
| 2004/0036111 A1 | 2/2004 | Nishikawa et al. |
| 2004/0038486 A1 | 2/2004 | Chua et al. |
| 2004/0038487 A1 | 2/2004 | Olsen |
| 2004/0038554 A1 | 2/2004 | Ahn et al. |
| 2004/0040501 A1 | 3/2004 | Vaartstra |
| 2004/0043149 A1 | 3/2004 | Gordon et al. |
| 2004/0043569 A1 | 3/2004 | Ahn et al. |
| 2004/0043630 A1 | 3/2004 | Vaartstra et al. |
| 2004/0046197 A1 | 3/2004 | Basceri et al. |
| 2004/0048491 A1 | 3/2004 | Jung et al. |
| 2004/0051152 A1 | 3/2004 | Nakajima |
| 2004/0053472 A1 | 3/2004 | Kiryu et al. |
| 2004/0053484 A1 | 3/2004 | Kumar et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0077182 A1 | 4/2004 | Lim et al. |
| 2004/0094808 A1 | 5/2004 | Joshi et al. |
| 2004/0135180 A1 | 7/2004 | Makita |
| 2004/0142577 A1 | 7/2004 | Sugawara et al. |
| 2004/0144308 A1 | 7/2004 | Yudovsky |
| 2004/0144311 A1 | 7/2004 | Chen et al. |
| 2004/0157391 A1 * | 8/2004 | Park et al. ............ 438/250 |
| 2004/0175961 A1 | 9/2004 | Olsen |
| 2004/0198069 A1 | 10/2004 | Metzner et al. |
| 2004/0203254 A1 | 10/2004 | Conley, Jr. et al. |
| 2004/0209468 A1 | 10/2004 | Kumar et al. |
| 2004/0216670 A1 | 11/2004 | Gutsche et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0242021 A1 | 12/2004 | Kraus et al. |
| 2004/0256664 A1 * | 12/2004 | Chou et al. ............ 257/324 |
| 2005/0006799 A1 | 1/2005 | Gregg et al. |
| 2005/0009358 A1 | 1/2005 | Choi et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0095859 A1 | 5/2005 | Chen et al. |
| 2005/0104142 A1 | 5/2005 | Narayanan et al. |
| 2005/0124109 A1 | 6/2005 | Quevedo-Lopez et al. |
| 2005/0130438 A1 * | 6/2005 | Rotondaro et al. ............ 438/762 |
| 2005/0130442 A1 | 6/2005 | Visokay et al. |
| 2005/0130448 A1 | 6/2005 | Olsen et al. |
| 2005/0153571 A1 | 7/2005 | Senzaki |
| 2005/0186765 A1 | 8/2005 | Ma et al. |
| 2005/0230047 A1 | 10/2005 | Collins et al. |
| 2005/0233156 A1 | 10/2005 | Senzaki et al. |
| 2005/0255243 A1 | 11/2005 | Senzaki |
| 2005/0260347 A1 | 11/2005 | Narwankar et al. |
| 2005/0260357 A1 | 11/2005 | Olsen et al. |
| 2005/0271812 A1 | 12/2005 | Myo et al. |
| 2005/0271813 A1 | 12/2005 | Kher et al. |
| 2006/0019033 A1 | 1/2006 | Muthukrishnan et al. |
| 2006/0032833 A1 | 2/2006 | Kawaguchi et al. |
| 2006/0042755 A1 | 3/2006 | Holmberg et al. |
| 2006/0060565 A9 | 3/2006 | Nallan et al. |
| 2006/0062917 A1 | 3/2006 | Muthukrishnan et al. |
| 2006/0153995 A1 | 7/2006 | Narwankar et al. |
| 2006/0178018 A1 | 8/2006 | Olsen |
| 2006/0208215 A1 | 9/2006 | Metzner et al. |
| 2006/0244035 A1 | 11/2006 | Bojarczuk et al. |
| 2006/0264067 A1 | 11/2006 | Kher et al. |
| 2006/0286763 A1 | 12/2006 | Ma et al. |
| 2007/0018244 A1 | 1/2007 | Hung et al. |
| 2007/0020890 A1 | 1/2007 | Thakur et al. |
| 2007/0026547 A1 | 2/2007 | Kumar et al. |
| 2007/0042601 A1 | 2/2007 | Wang et al. |
| 2007/0049043 A1 | 3/2007 | Muthukrishnan et al. |
| 2007/0049053 A1 | 3/2007 | Mahajani |
| 2007/0077767 A1 | 4/2007 | Jin et al. |
| 2007/0087583 A1 | 4/2007 | Olsen et al. |
| 2007/0093012 A1 | 4/2007 | Chua et al. |
| 2007/0099438 A1 | 5/2007 | Ye et al. |
| 2007/0111458 A1 | 5/2007 | Sato et al. |
| 2007/0141856 A1 | 6/2007 | Sato et al. |
| 2007/0199922 A1 | 8/2007 | Shen et al. |
| 2007/0209930 A1 | 9/2007 | Chua et al. |
| 2007/0212895 A1 | 9/2007 | Chua et al. |
| 2007/0212896 A1 | 9/2007 | Olsen et al. |
| 2007/0218623 A1 | 9/2007 | Chua et al. |
| 2008/0032510 A1 | 2/2008 | Olsen |

FOREIGN PATENT DOCUMENTS

| | | |
|---|---|---|
| EP | 0 464 515 | 6/1991 |
| EP | 0 497 267 | 8/1992 |
| EP | 0847079 | 6/1998 |
| EP | 0 973 189 | 7/1999 |
| EP | 0 973 191 | 1/2000 |
| EP | 0973191 A1 | 1/2000 |
| EP | 1170804 A2 | 1/2001 |
| EP | 1146141 A2 | 10/2001 |
| EP | 1 167 569 | 1/2002 |
| EP | 1 321 973 A2 | 6/2003 |
| GB | 2 355 727 A | 10/2000 |
| JP | 58-098917 | 6/1983 |
| JP | 01-143221 | 6/1989 |
| JP | 04-291916 | 10/1992 |
| JP | 05-047666 | 2/1993 |
| JP | 05-206036 | 8/1993 |
| JP | 05-234899 | 9/1993 |
| JP | 05-251339 | 9/1993 |
| JP | 05-270997 | 10/1993 |
| JP | 06-196809 | 7/1994 |
| JP | 06-224138 | 8/1994 |
| JP | 7-300649 A | 11/1995 |
| JP | 2000-212752 | 8/2000 |
| JP | 2000-319772 | 11/2000 |
| JP | 2001-020075 | 1/2001 |
| JP | 2001-111000 A | 4/2001 |
| JP | 2001-172767 | 6/2001 |
| JP | 2002-060944 A | 2/2002 |
| JP | 2002-69641 A | 3/2002 |
| JP | 2002-93804 A | 3/2002 |
| JP | 2002-167672 A | 6/2002 |
| JP | 2002-172767 A | 6/2002 |
| TW | 386267 | 4/2000 |
| TW | 480569 | 3/2002 |
| TW | 490765 | 6/2002 |
| TW | 556268 | 10/2003 |
| WO | WO 96/17107 | 6/1996 |
| WO | WO 99/01595 | 1/1999 |
| WO | WO 99/29924 | 6/1999 |
| WO | WO 99/65084 | 12/1999 |
| WO | WO 00/13235 | 3/2000 |
| WO | WO 00/15220 | 3/2000 |
| WO | WO 00/16377 | 3/2000 |
| WO | WO 00/54320 | 9/2000 |
| WO | WO 00/70674 | 11/2000 |
| WO | WO 00/79576 | 12/2000 |
| WO | WO 01/17692 A1 | 3/2001 |
| WO | WO 01/25502 A1 | 4/2001 |
| WO | WO 01/27346 A1 | 4/2001 |
| WO | WO 01/27347 A1 | 4/2001 |
| WO | WO 01/29280 A1 | 4/2001 |
| WO | WO 01/29891 A1 | 4/2001 |
| WO | WO 01/29893 A1 | 4/2001 |
| WO | WO 01/36702 | 5/2001 |
| WO | WO 01/40541 A1 | 6/2001 |
| WO | WO 01/66832 A2 | 9/2001 |
| WO | WO 01/82390 A1 | 11/2001 |
| WO | WO 01/99166 | 12/2001 |
| WO | WO 02/01628 A2 | 1/2002 |

| WO | WO 02/08488 | 1/2002 |
| WO | WO 02/09167 A2 | 1/2002 |
| WO | WO 02/27063 A2 | 4/2002 |
| WO | WO 02/43115 A2 | 5/2002 |
| WO | WO 02/45167 A2 | 6/2002 |
| WO | WO 02/45871 | 6/2002 |
| WO | WO 03/023835 | 3/2003 |
| WO | WO-2005/113855 A1 | 12/2005 |
| WO | WO 2005/117086 | 12/2005 |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

Balog, et al. "Chemical Vapor Deposition and Characterization of $HfO_2$ Films from Organo-Hafnium Compounds," Thin Solid Films, 41 (1977) 247-259.

Bedair, "Atomic Layer Epitaxy Deposition Processes," J. Vac. Sci. Technol. B., vol. 12, No. 1, Jan./Feb. 1994.

Chatham, Hood; et al. "Nitridation of Hafnium Silicate Thin Films", Mat. Res. Soc. Symp. Proc. vol. 811, Apr. 12-16, 2004, D7.5.1.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

International Search Report for International Application No. PCT/US2005/016606 dated Aug. 22, 2005.

International Search Report for International Application No. PCT/US2005/016603 dated Sep. 15, 2005.

International Search Report for International Application No. PCT/US2005/016690 dated Aug. 22, 2005.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Written Opinion of the International Search Report for International Application No. PCT/US2005/016606 dated Aug. 22, 2005.

Written Opinion of the International Search Report for International Application No. PCT/US2005/016603 dated Sep. 15, 2005.

Written Opinion of the International Search Report for International Application No. PCT/US2005/016690 dated Aug. 22, 2005.

Ho, et al., "Suppressed crystallization of Hf-based gate dielectrics by controlled addition of $Al_2O_3$ using atomic layer deposition", Applied Physics Letters, American Institute of Physics, New York, US, vol. 81, No. 22, Nov. 25, 2002, pp. 4218-4220.

Kawahara, et al., "Effects of Hf sources, oxidizing agents, and $NH_3$ radicals on properties of $HfAlO_x$, films prepared by atomic layer deposition", IWGI 2003, Tokyo, Nov. 8, 2003, pp. 32-37.

Kukli, et al., "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Ohshita, et al., "$Hf_{1-x}Si_xO_2$ deposition by metal organic chemical vapor deposition using the $Hf)NEt_2)_4/SiH(NEt_2)_3/O_2$ gas system", Preparation and Characterization, Elsevier Sequola, NL, vol. 416, No. 1-2, Sep. 2, 2002, pp. 208-211.

Visokay, et al., "Application of HfSiON as a gate dielectric material", Applied Physics Letter, American Institute of Physics, New York, US, vol. 80, No. 17, Apr. 29, 2002, pp. 3183-3185.

Argarwal, et al. "Challenges in Integrating the High-K Gate Dielectric Film to the Conventional CMOS Process Flow," Mat. Sec. Soc. Sump. Proc. vol. 670 (2001).

Chatham, Hood; et al., "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Choi, et al. "Stability of $TiB_2$ as a Diffusion Barrier on Silicon," J. Electrochem. Soc., vol. 138, No. 10, Oct. 1991.

Choi, et al. "The Effect of Annealing on Resistivity of Low Pressure Chemical Vapor Deposited Titanium Diboride," J. Appl. Phys. 69(11),Jun. 1, 1991.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F., "Interval Annealing During Alternating Pulse Deposition", et al., Mat. Res. Soc. Symp. Proc. vol. 811, Apr. 12-16, 2004, D1.3.1.

Derbyshire, "Applications of Integrated Processing," Solid State Technology, Dec. 1994.

Elers, et al. "$NbCl_5$ as a Precursor in Atomic Layer Epitaxy," Applied Surface Science 82/83 (1994) 468-474.

George, et al. "Surface Chemistry for Atomic Layer Growth," J. Phys. Chem. (1996), 100, 13121-13131.

Hendrix, et al., "Composition Control of $Hf_{1-x}Si_xO_2$ Films Deposited on Si by Chemical-vapor Deposition Using Amide Precursors," Applied Physics Letters, vol. 80, No. 13 (Apr. 1, 2002).

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

Kattelus, et al. "Electrical Properties of Tantalum Based Composite Oxide Films," Mat. Res. Soc. Symp. Proc., 284 (1993) 511-516.

Kukli, et al. "Tailoring the Dielectric Properties of $HfO_2$-$Ta_2O_5$ Nanolaminates," Applied Physics Letters, vol. 68, No. 26 (Jun. 24, 1996), pp. 3737-3739.

Lee, et al. "Cyclic Technique for the Enhancement of Highly Oriented Diamond Film Growth," Thin Solid Films 303 (1997) 264-269.

Min, et al. "Chemical Vapor Deposition of Ti-Si-N Films with Alternating Source Supply," Mat. Res. Soc. Symp. Proc. vol. 564 (1999).

Min, et al. "Metal-organic Atomic-layer Deposition of Titanium-silicon-nitride Films," Applied Physics Letters, vol. 75, No. 11 (Sep. 11, 1999).

Niinisto, et al. "Synthesis of Oxide Thin Films and Overlayers by Atomic Layer Epitaxy for Advanced Applications," Materials Science and Engineering B41 (1996) 23-29.

Ohshita, et al. "$HfO_2$ Growth by Low-pressure Chemical Vapor Deposition Using the $Hf(N(C_2H_5)_2)_4/O_2$ Gas System," Journal of Crystal Growth 233 (2001) 292-297.

Ritala, et al. Ann. Acad. Sci. Fenn. Ser. A II. Chemica 257 (1994) 1-48.

Ritala, et al. "Atomic Layer Deposition of Oxide Thin Films with Metal Alkoxides as Oxygen Sources," Science vol. 288 Apr. 14, 2000.

Ritala, et al., "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Senzaki, Yoshihide, et al., "A Novel Atomic Layer Deposition Process to Deposit Hafnium Silicate Thin Films", Electrochemical Society Proceedings vol. 2004-01, pp. 264-270.

Applied Materials Instruction Manual "AMP 3300 Plasma I—Low Temperature Nitride Reactor System", Semiconductor Systems Division, Protective Order—Civil No. 02-CV-3457, dated Jan. 18, 1979.

Carre et al. "Semiconductor Manufacturing Technology at IBM", *IBM J. Res. Develop*, vol. 26, No. 5, Sep. 1982, pp. 528-531.

Collins, et al. "Silicon Process Technology for Monolithic Memory", *IBM J. Res. Develop*, Jan. 1972, pp. 2-10.

Cote, et al. "Plasma-Assisted Chemical Vapor Deposition of Dielectric Thin Films for ULSI Semiconductor Circuits", *IBM J. Res. Develop*, vol. 43, No. ½, Jan./Mar. 1999, pp. 5-38.

Deen, et al. Proceedings of the Symposium on "Silicon Nitride and Silicon Dioxide Thin Insulating Films", 1994, *Electrochemical Society, Inc.* vol. 97-10 pp. 229-243.

Dell'oca, et al. "Anodic Oxide Films", *Physics of Thin Films*, vol. 6, H. Francombe and R. W. Hoffmann, Eds., Academic Press, Inc., New York, 1971, pp. 1-79.

Freidal, et al. "Review of Oxidation Processes in Plasmas", *J. Physics Chem. Solids*, vol. 44, No. 5, pp. 353-364, 1983.

Fromhold, Jr., et al. "Oxide Growth in an rf Plasma", *J. Appl. Phys.* 51(12), Dec. 1980, pp. 6377-6392.

Gourrier, et al. "Review of Oxide Formation in a Plasma", *Plasma Chemistry and Plasma Processing* vol. 1, No. 3, 1982, pp. 217-232.

Hess "Plasma-Assisted Oxidation Anodization, and Nitridation of Silicon", *IBM J. Res. Develop*, vol. 43, No. ½, Jan./Mar. 1999, pp. 127-145.

Kasprzak, et al. "Near-Ideal Si-SiO$_2$ Interfaces", *IBM J. Res. Develop*, vol. 24, No. 3 May 1980, pp. 348-352.

Kawai, et al. "Ultra-Low-Temperature Growth of High-Integrity Gate Oxide Films by Low-Energy Ion-Assisted Oxidation", *Applied Physics Letters*, vol. 64, No. 17, Apr. 25, 1994, pp. 2223-2225.

Kuo, et al. "Plasma Processing in the Fabrication of Amorphous Silicon Thin-Films-Transistor Arrays", *IBM J. Res. Develop*, vol. 43, No. ½, Jan./Mar. 1999, pp. 73-88.

Nakanishi, et al. "Studies on SiO$_2$- SiO$_2$ Bonding with Hydrofluoric Acid—Room Temperature and Low Stress Bonding Technique for Mems-"; *IEEE*, 1998, pp. 609-614.

Nelson, et al. "A Structural and Electrical Comparison of Thin SiO$_2$ Films Grown on Silicon by Plasma Anodization and Rapid Thermal Processing to Furnace Oxidation", *Applied Physics Letters*, vol. 63, No. 10, May 15, 1988, pp. 5027-5035.

Nelson, et al. "Thin Silicon Oxides Grown by Low-Temperature RF Plasma Anodization and Deposition", *Applied Physics Letters*, vol. 50, pp. 1095-1097 (1987).

O'Hanlon "Gas Discharge Anodization", *Oxides and Oxide Films*, vol. 5, A.K. Vijh, Ed., Marcel Dekker, New York, 1977, *IBM Corporation*, Chpt. 2, pp. 105-166.

Oana 5.1: Current & Future Technology of Low Temperature Poly-Si TFT—LCDs:, Toshiba Corporation, pp. 1-4.

Okorn-Schmidt "Characterization of Silicon Surface Preparation Processes for Advanced Gate Dlelectrics", *IBM J. Res. Develop*, vol. 43, No. 3, May 1999, pp. 351-365.

Pulfrey, et al. "Preparation and Properties of Plasma-Anodized Silicon Dioxide Films", *Solid State Electronics*, 1974, vol. 17, pp. 627-632.

Pulfrey, et al. "The Anodization of Si in an RF Plasma", *Solid State Science and Technology*, 1974, vol. 120, No. 11, pp. 1529-1535, Nov. 1972.

Reisman "Assisted Oxidation and Annealing in VLSI and ULSI", *Department of Electrical and Computer Engineering*, 1986, pp. 364-378.

Roy, et al. "Stacked High-ϵ Gate Dielectric for Gigascale Integrated of Metal-Oxide-Semiconductor Technologies", *Applied Physics Letters*, vol. 72, No. 22, Jun. 1, 1998, pp. 2835-2837.

Singer "High-K, Metal Gates a 'Go' for 45 nm", Semiconductor International Reed Business Information 2007.

Taylor, et al. "A Review of the Plasma Oxidation of Silicon and its Applications", *Semiconductor Science Tech.* vol. 8, 1993, pp. 1426-1433.

Vossen, et al. "Thin Film Processes", *Academic Press Inc.*, 1978, Chpt II., pp. 24-73.

First Office Action for CN 2005800061381, May 9, 2008.

PCT International Search Report and the Written Opinion for International Application No. PCT/US2006/022997 dated Nov. 9, 2006.

Official Letter from European Patent Office for Application No. 05 749 300.9-1235, dated Aug. 19, 2009.

\* cited by examiner

FORMATION OF A SILICON OXYNITRIDE LAYER ON A HIGH-K DIELECTRIC MATERIAL

BACKGROUND OF THE INVENTION

Field of the Invention

Embodiments of the present invention generally relate to methods for depositing materials on substrates, and more specifically, to methods for depositing capping layers, such as silicon oxides or silicon oxynitrides, to dielectric materials.

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

While conventional chemical vapor deposition has proved successful for device geometries and aspect ratios down to 0.15 microns, the more aggressive device geometries require new, innovative deposition techniques. One technique that is receiving considerable attention is atomic layer deposition (ALD). In the scheme, reactants are sequentially introduced into a processing chamber where each reactant chemisorbs onto the substrate surface and a reaction occurs. A purge step is typically carried out between the delivery of each reactant gas. The purge step may be a continuous purge with the carrier gas or a pulse purge between the delivery of the reactant gases.

One problem that interferes with small device assembly has been elemental diffusion from one material layer to another layer. Contamination by elemental diffusion is very prominent in material layers that are adjacent to doped polysilicon, since the dopants (e.g., boron) readily diffuse. In order to limit dopant diffusion, nitridation processes have been used to densify dielectric high-k materials, such as hafnium silicate. The densification process incorporates nitrogen in the dielectric material and forms Si—N bonds and Hf—N bonds. While the Si—N bonds are desirable, the Hf—N bonds are undesirable since their metallic characteristics increase leakage. Also, the industry has been struggling to introduce high-k materials that are compatible on the substrate, since the interaction between polysilicon and the many high-k materials usually have the wrong work-function threshold shift.

Alternatively, silicon nitride has been used as an effective boron barrier layer at the dielectric/gate interface. However, the material has poor device properties due to inherently fixed charges. A desirable barrier layer should form the dielectric/gate interface and enhances the mobility of charge carriers in the polysilicon by blocking dopant diffusion from the polysilicon layer.

In the prior art, ALD processes have been used to deposit thin silicon oxide layers. Silicon oxide deposited by an ALD process, plasma treated and subsequently annealed has been utilized as a capping layer. However, silicon oxide layers are often deposited by ALD processes that alternate pulses of dichlorosilane ($Cl_2SiH_2$) with water or oxygen. The silicon oxide may be contaminated with halogen impurities due to the chlorinated silane precursors. If silicon oxide layers contaminated with halogens are used as dopant barrier layers, chlorine may diffuse into the polysilicon layer adversely effecting the charge carrier mobility.

Therefore, there is a need for a deposition process to cap a dielectric material with a barrier layer, such as silicon oxide or silicon oxynitride. The barrier layer should be free of halogen contamination and be as thin as possible while reducing dopant diffusion, as well as the barrier layer and the dielectric layer should be chemically compatible.

SUMMARY OF THE INVENTION

In one embodiment, a method for depositing a capping layer on a dielectric layer is provided which includes depositing the dielectric layer on a substrate, depositing a silicon-containing layer on the dielectric layer by an ALD process, comprising alternately pulsing a silicon precursor and an oxidizing gas into a process chamber, exposing the silicon-containing layer to a nitridation process and exposing the substrate to an anneal process In another embodiment, a method for depositing a capping layer on a dielectric layer in a process chamber is provided which includes depositing the dielectric layer on a substrate, exposing the dielectric layer to an ALD process, comprising alternately pulsing a silicon precursor and an oxidizing gas into the process chamber, depositing a silicon-containing layer on the dielectric layer, and exposing the silicon-containing layer to a nitridation process.

In another embodiment, a method for depositing a silicon-containing capping layer on a dielectric layer in a process chamber by an ALD process is provided which includes flowing a silicon precursor into the process chamber, purging the process chamber with a purge gas, flowing an oxidizing gas comprising water formed by flowing a $H_2$ gas and an oxygen-containing gas through a water vapor generator, and purging the process chamber with the purge gas.

In another embodiment, a method for depositing a silicon-containing layer on a substrate surface in a process chamber is provided which includes exposing the substrate surface to a silicon precursor and an oxidizing gas comprising water formed by flowing a $H_2$ gas and an oxygen-containing gas through a water vapor generator, and exposing the substrate surface to a nitridation process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION OF THE PREFERRED EMBODIMENT

Figure 1:
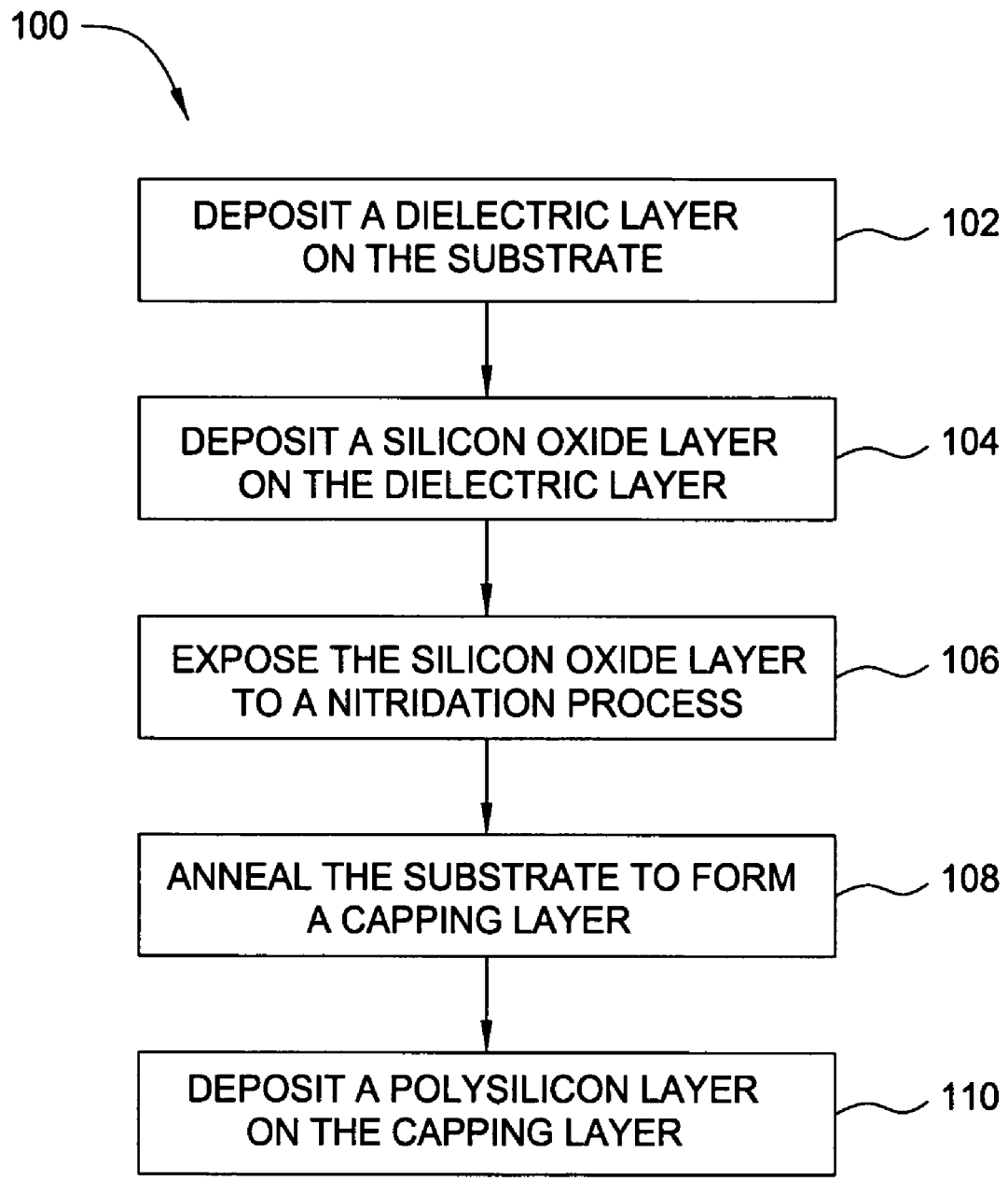
FIG. 1 illustrates a process sequence for forming a capping layer on a dielectric layer according to one embodiment described herein.

The present invention provides methods for preparing silicon-containing compounds used in a variety applications including as capping barrier layers on high-k dielectric materials. The methods use atomic layer deposition (ALD) to have elemental control of the composition of the silicon compounds. In one embodiment, the process includes an in-situ water generator to produce an oxidizing gas used with a silicon precursor to deposit silicon-containing material. The ALD processes utilizing the in-situ water generator to grow silicon-containing material neatly and efficiently, thereby significantly increasing production throughput. In other aspects, silicon-containing materials are nitrided by nitrogen plasma, such as with decoupled plasma nitridation (DPN), and subsequently annealed.

A "substrate surface" as used herein refers to any substrate or material surface formed on a substrate upon which film processing is performed. For example, a substrate surface on which processing may be performed include materials such as dielectric materials, silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride. Substrates may have various dimensions, such as 200 mm or 300 mm diameter wafers, as well as, rectangular or square panes. Embodiments of the processes described herein deposit silicon-containing compounds on many substrates and surfaces, especially, high-k dielectric materials. Substrates on which embodiments of the invention may be useful include, but are not limited to semiconductor wafers, such as crystalline silicon (e.g., Si<100> or Si<111>), silicon oxide, strained silicon, SOI, silicon germanium, doped or undoped polysilicon, doped or undoped silicon wafers silicon nitride and patterned or non-patterned wafers. Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and/or baking.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein to refer to a precursor pulse step followed by a purge step.

In FIG. 1, illustrates an exemplary process sequence 100 for forming a capped dielectric film, such as a silicon oxide layer on a high-k gate dielectric material. FIGS. 2A-2F correspond to process sequence 100 to illustrate the assembly of a semiconductor device, such as a transistor. In step 102, a dielectric layer 210 is deposited on a substrate 200, depicted in FIGS. 2A-2B, by conventional deposition techniques, such as ALD, chemical vapor deposition (CVD), physical vapor deposition (PVD), thermal techniques and combinations thereof. In a preferred embodiment, dielectric layer 210 is deposited by an ALD process and apparatus, such as described in co-pending U. S. Provisional patent application Ser. No. unknown, filed May 12, 2004, entitled, "Atomic Layer Deposition of Hafnium-containing High-K Materials," assigned to Applied Materials, Inc., and is herein incorporated by reference. Dielectric layer 210 is generally deposited with a film thickness from about 10 Å to about 1,000 Å, preferably from about 20 Å to about 500 Å and more preferably from about 50 Å to about 200 Å, for example, about 100 Å.

A substrate may be pretreated before depositing dielectric layer 210 in order to have termination with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) and amidos (NR or $NR_2$, where R=H, Me, Et, Pr or Bu). A pretreatment may be effected by administering a reagent, such as $NH_3$, $B_2H_6$, $SiH_4$, $Si_2H_6$, $H_2O$, HF, HCl, $O_2$, $O_3$, $H_2O$, $H_2O/O_2$, $H_2O/H_2$, $H_2O_2$, $H_2$, atomic-H, atomic-N, atomic-O, alcohols or amines. Once the surface of the substrate is pretreated, an ALD cycle is started. For many of the high-k dielectric materials, the precursor adsorption is self-limiting under certain process conditions, and generally is at low temperatures (<300° C.) to exhibit this behavior. In one embodiment, the pretreatment may involve a presoak with a reagent prior to depositing a hafnium compound. The presoak may involve exposing the substrate surface to the reagent for a period of time from about 5 seconds to about 120 seconds, preferably from about 5 seconds to about 30 seconds. In one example, the substrate surface is exposed to water vapor for 15 seconds prior to starting an ALD process to deposit dielectric layer 210.

Dielectric layer 210 is deposited on the substrate surface and may have a variety of compositions that are homogenous, heterogeneous, graded and/or multiple layered stacks or laminates. Dielectric layer 210 is generally a high-k dielectric material and may include combinations of hafnium, zirconium, titanium, tantalum, lanthanum, aluminum, silicon, oxygen and/or nitrogen. Dielectric layer 210 may have a composition that includes hafnium-containing materials, such as hafnium oxides ($HfO_x$ or $HfO_2$), hafnium silicates ($HfSi_xO_y$ or $HfSiO_4$), hafnium silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium-containing materials, such as zirconium oxides ($ZrO_x$ or $ZrO_2$), zirconium silicates ($ZrSi_xO_y$ or $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), derivatives thereof and combinations thereof. Other dielectric materials useful for dielectric layer 210 may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for dielectric layer 210 include $HfO_2/Al_2O_3$, $HfO_2/SiO_2$, $La_2O_3/Al_2O_3$ and $HfO_2/SiO_2/Al_2O_3$.

Figure 2A:
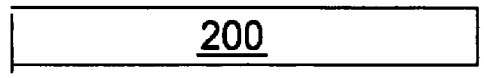
FIGS. 2A-2F illustrate a process sequence for depositing multiple layers on a substrate surface according to another embodiment described herein.
Figure 2B:
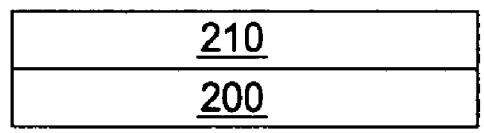
Figure 2C:
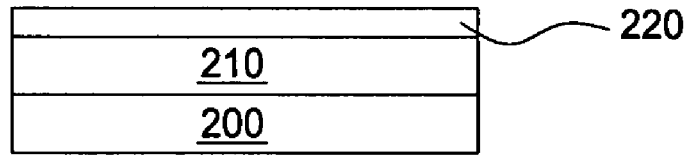

In step 104, a silicon oxide layer 220 is deposited on dielectric layer 210 by an ALD process, as depicted in FIG. 2C. Silicon oxide layer 220 may include silicon dioxide ($SiO_2$) or other silicon oxides ($SiO_x$), such as less oxidized forms. Generally, silicon oxide layer 220 is deposited with a thickness in a range from about 1 Å to about 20 Å, preferably from about 2 Å to about 10 Å, and more preferably from about 3 Å to about 8 Å, for example, about 5 Å. In many embodiments, silicon oxide layer 220 is about 5 Å or less.

Prior to the deposition of silicon oxide layer 220, the dielectric layer 210 may be exposed to a pretreatment step similarly disclosed for pretreatment of substrate 200 prior to the deposition of dielectric layer 210. The substrate is loaded into a process chamber capable of performing cyclical deposition and the process conditions are adjusted. Process conditions may include temperature, pressure and flow rate of carrier gas. In one embodiment, the process chamber used to deposit silicon oxide layer 220 is the same process chamber used to deposit the dielectric layer 210. In another embodiment, a first process chamber is used to deposit the dielectric layer 210 and a second process chamber is used to deposit silicon oxide layer 220. The first process chamber and the second process chamber may be on different cluster tools, but preferably on the same cluster tool.

Figure 3:
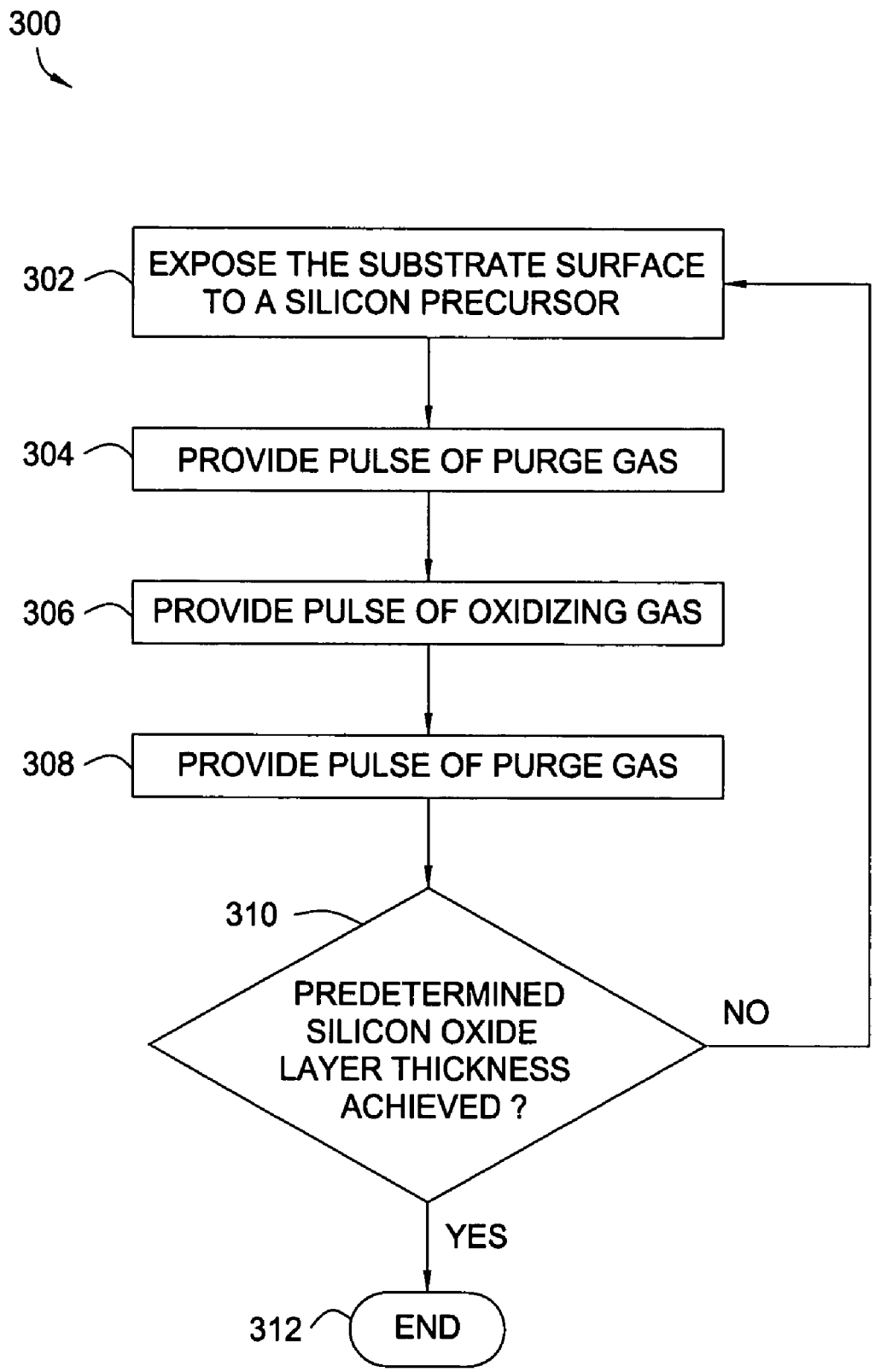
FIG. 3 illustrates ALD pulsing sequences for the silicon precursor and oxidizing gas according to one embodiment described herein.

ALD process 300 forms a silicon oxide layer 220, according to one embodiment of the present invention, as depicted in FIG. 3. In step 302, dielectric layer 210 on the substrate surface is exposed to pulse of a silicon precursor that is introduced into the process chamber for a time period in a range from about 0.1 seconds to about 5 seconds. A pulse of purge gas is then pulsed into the processing chamber to purge or otherwise remove any residual silicon precursor or by-products in step 304. In step 306, a pulse of oxidizing gas is introduced into the processing chamber. The oxidizing gas may include several agents, such as in-situ water, oxygen, or hydrogen. A pulse of purge gas is then introduced into the processing chamber to purge or otherwise remove any residual oxidizing gas or by-products in step 308. Suitable carrier gases or purge gases may include helium, argon, nitrogen, hydrogen, forming gas, oxygen, and combinations thereof.

After each deposition cycle, a silicon oxide layer 220 is formed having a particular thickness. Generally, about 8 ALD process cycles are completed to form silicon oxide layer 220 with a thickness of about 5 Å. Depending on specific device requirements, subsequent deposition cycles may be needed to deposit silicon oxide layer 220 having a predetermined thickness in step 310. In step 312, once the predetermined thickness of silicon oxide layer 220 is achieved, ALD process 300 is ceased.

The cyclical deposition process or ALD process typically occurs at a pressure in the range from about 1 Torr to about 100 Torr, preferably in the range from about 1 Torr to about 20 Torr, for example about 10 Torr. The temperature of the substrate is usually in the range from about 70° C. to about 1,000° C., preferably from about 100° C. to about 450° C., and more preferably from about 200° C. to about 400° C.

In step 302, the silicon precursor is introduced to the process chamber at a rate in the range from about 5 sccm to about 200 sccm. The silicon precursor is usually introduced with a carrier gas, such as nitrogen, with a total flow rate in the range from about 50 sccm to about 1,000 sccm. The silicon precursor is pulsed into the process chamber at a rate from about 0.1 seconds to about 10 seconds, depending on the particular process and desired silicon oxide layer 220. In one embodiment, the silicon precursor is pulsed at a rate from about 1 second to about 5 seconds, for example, about 3 seconds. In another embodiment, the silicon precursor is pulsed at a rate from about 0.1 seconds to about 1 second, for example, about 0.5 seconds. In one embodiment, the silicon precursor is preferably tetrakis(dimethylamino)silane (($Me_2N)_4Si$ or TDMAS) or tris(dimethylamino)silane (($Me_2N)_3SiH$ or Tris-DMAS).

In step 306, the oxidizing gas is introduced to the process chamber at a rate in the range from about 20 sccm to about 1,000 sccm, preferably in the range from about 50 sccm to about 200 sccm. The oxidizing gas is pulsed into the process chamber at a rate from about 0.1 seconds to about 10 seconds, depending on the particular process. In one embodiment, the oxidizing gas is pulsed at a rate from about 1 second to about 5 seconds, for example, about 1.7 seconds. In another embodiment, the oxidizing gas is pulsed at a rate from about 0.1 seconds to about 3 seconds, for example, about 0.5 seconds.

The oxidizing gas is produced from a water vapor generating (WVG) system that is in fluid communication to the process chamber by a line. The WVG system generates ultra-high purity water vapor by means of a catalytic reaction of $O_2$ and $H_2$. The $H_2$ and the $O_2$ each flow into the WVG system at a rate in the range from about 20 sccm to about 200 sccm. Generally, the flow of $O_2$ is higher than the flow of $H_2$, for example, the $H_2$ has a flow rate of about 100 sccm and $O_2$ has a flow rate of about 120 sccm. Therefore, the water vapor flowing out of the WVG system is $O_2$ enriched. When the $H_2$ flow rate is about 100 sccm and the $O_2$ flow rate is about 120 sccm, the outflow of oxidizing gas includes a water vapor with a flow rate about 100 sccm and an $O_2$ with a flow rate about 70 sccm. Once a preferred $H_2/O_2$ concentration is determined, each flow rate may be proportionately altered to adjust the outward flowing water vapor with the same $H_2/O_2$ concentration. In another example, $H_2$ has a flow rate about 50 sccm and $O_2$ has a flow rate about 60 sccm.

The WVG system has a catalyst-lined reactor or a catalyst cartridge in which water vapor is generated by means of a catalytic chemical reaction, unlike pyrogenic generators that produce water vapor as a result of ignition. The catalyst may include a metal or alloy, such as palladium, platinum, nickel, combinations thereof, and alloys thereof. The ultra-high purity water is ideal for the ALD processes in the present invention. In one embodiment, to prevent unreacted $H_2$ from flowing downstream, $O_2$ is allowed to flow through the WVG system for 5 seconds. Next, $H_2$ is allowed to enter the reactor for about 5 seconds. The catalytic reaction between $H_2$ and $O_2$ is instantaneous, so water vapor is generated immediately after the $H_2$ and $O_2$ reach the reactor. Regulating the flow of $H_2$ and $O_2$ allows the concentration to be precisely controlled at any point from 1% to 100% concentrations, that is, the water vapor may contain water, $H_2$, $O_2$, or combinations thereof. In one example, the water vapor contains water and $O_2$. In another example, the water vapor contains water and $H_2$. Similarly, by employing the same method of gas flow control, the amount of water vapor may also be regulated, yielding accurate and repeatable flows every time. While water vapor is usually generated by flowing $H_2$ and $O_2$ into the reactor, the $O_2$ may be supplemented or substituted with another oxygen source compound, such as NO, $N_2O$, $NO_2$, $N_2O_5$, $H_2O_2$, or $O_3$. In one embodiment, $H_2$ and $N_2O$ are utilized to form a water vapor that is used in the various ALD processes throughout the present disclosure. Suitable WVG systems are commercially available, such as the WVG by Fujikin of America, Inc., located in Santa Clara, Calif., and the CSGS (Catalyst Steam Generator System) by Ultra Clean Technology, located in Menlo Park, Calif.

The pulses of a purge gas, preferably argon or nitrogen, at steps 304 and 308, are typically introduced at a rate from about 2 slm to about 22 slm, preferably at about 10 slm. Each processing cycle (steps 302 through 308) lasts from about 0.01 seconds to about 20 seconds. For example, in one embodiment, the processing cycle is about 10 seconds, while in another embodiment, the processing cycle is about 2 seconds. The specific pressures and times are obtained through routine experimentation. In one example, a 300 mm diameter wafer needs about twice the flow rate as a 200 mm diameter wafer in order to maintain similar throughput.

In one embodiment, hydrogen gas is applied as a carrier gas, purge and/or a reactant gas to reduce halogen contamination from the film. Precursors that contain halogen atoms (e.g., $Cl_2SiH_2$, $SiCl_4$ and $Si_2Cl_6$) may readily contaminate the film. Hydrogen is a reductant and will produce hydrogen halides (e.g., HCl) as a volatile and removable by-product. Therefore, hydrogen may be used as a carrier gas or reactant gas when combined with a precursor compound (i.e., silicon or oxygen precursors) and may include another carrier gas (e.g., Ar or $N_2$). In one aspect, a water/hydrogen mixture, at a temperature in the range from about 100° C. to about 500° C., is used to reduce the halogen concentration and increase the oxygen concentration of the film.

Many silicon precursors are within the scope of the invention. One important precursor characteristic is to have a favorable vapor pressure. Precursors at ambient temperature and pressure may be gas, liquid, or solid. However, within the ALD chamber, volatilized precursors are utilized. Exemplary silicon precursors include silanes, alkylsilanes, alkylaminosilanes, silanols, and alkoxy silanes, for example, silicon precursors include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSiH_3$, $Me_2SiH_2$, $EtSiH_3$, $Et_2SiH_2$, $MeSi(OH)_3$, $Me_2Si(OH)_2$, $(EtO)_4Si$, derivative thereof, and combinations thereof. Other alkoxy silanes may be described by the generic chemical formula $(RO)_{4-n}SiL_n$, where n=0-3, R=methyl, ethyl, propyl, or butyl and L=H, OH, F, Cl, Br, or I, and combinations thereof. Other alkylsilane compounds useful as silicon precursors include $R_{4-n}SiH_n$, where R is independently methyl, ethyl, propyl, butyl, or other alkyl and n=0-3. Other alkylaminosilane compounds useful as silicon precursors include $(RR'N)_{4-n}SiH_n$, where R or R' are independently hydrogen, methyl, ethyl, propyl, or butyl and n=0-3. Also, higher silanes are used as silicon precursors within some embodiments of the invention.

Higher silanes are disclosed in commonly assigned U.S. Ser. No. 10/688,797, filed on Oct. 17, 2003, entitled, "Silicon-containing Layer Deposition with Silicon Compounds," and published as U. S. Pub. No. 2004-0224089, which is incorporated herein by reference in entirety for the purpose of describing silicon precursors. Some preferred silicon precursors include $(Me_2N)_3SiH$, $(Et_2N)_3SiH$, $(Me_2N)_4Si$, $(Et_2N)_4Si$, and $(MeEtN)_4Si$.

In another embodiment, steps 102 and 104 are performed in the same ALD chamber by ceasing the flow of particular reagents, such as a metal precursor, used in step 102, but not used in step 104. For example, dielectric layer 210, comprising hafnium silicate, is deposited as by performing an ALD process that includes sequentially pulsing $HfCl_4$, water vapor, TDMAS and water vapor, with each precursor separated by a purge cycle. The dielectric layer 210 is formed by repeating the ALD cycle until the film has a thickness of about 100 Å, therefore, completing step 102. Without stopping the ALD cycle, the $HfCl_4$ half reaction and one of the water vapor half reactions are ceased and step 104 has begun. The ALD process proceeds by sequentially pulsing TDMAS and water vapor, with each precursor separated by a purge cycle. After about 8 cycles of the ALD process, a 5 Å silicon oxide layer 220 is formed on dielectric layer 210 containing the hafnium silicate.

Figure 2D:
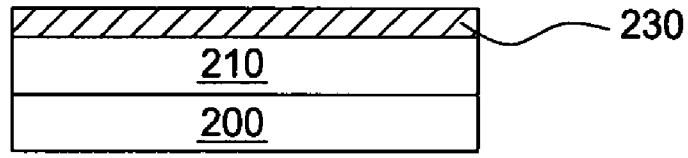

The substrate is transferred to a decoupled plasma nitridation (DPN) chamber, such as the CENTURA™ DPN chamber, available from Applied Materials, Inc., located in Santa Clara, Calif. In one embodiment, the DPN chamber is on the same cluster tool as the ALD chamber used to deposit the dielectric layer 210 and/or the ALD chamber used to deposit the silicon oxide layer 220. Therefore, the substrate may be exposed to a nitridation process without being exposed to the ambient environment. In FIG. 1, step 106, the silicon oxide layer 220 is exposed to a nitridation process. The nitridation process physically incorporates nitrogen atoms into the silicon oxide material to form nitrogen-containing silicon oxide layer 230, as depicted in FIG. 2D. The nitrogen concentration of nitrogen-containing silicon oxide layer 230 may be in the range from about 5 atomic percent (at %) to about 40 at %, preferably from about 10 at % to about 25 at %.

Preferably, the nitridation process exposes the silicon oxide layer 220 to nitrogen plasma, such as a DPN process. During a DPN process, the silicon oxide layer 220 is bombarded with atomic-N formed by co-flowing $N_2$ and a noble gas plasma, such as argon. Besides $N_2$, other nitrogen-containing gases may be used to form the nitrogen plasma, such as $NH_3$, hydrazines (e.g., $N_2H_4$ or $MeN_2H_3$), amines (e.g., $Me_3N$, $Me_2NH$ or $MeNH_2$), anilines (e.g., $C_6H_5NH_2$), and azides (e.g., $MeN_3$ or $Me_3SiN_3$). Other noble gases that may be used in a DPN process include helium, neon and xenon. The nitridation process proceeds at a time period from about 10 seconds to about 120 seconds, preferably from about 15 seconds to about 60 seconds, for example, about 30 seconds. Also, the nitridation process is conducted with a plasma power setting at about 900 watts to about 2,700 watts and a pressure at about 10 mTorr to about 100 mTorr. The nitrogen has a flow from about 0.1 slm to about 1.0 slm, while the noble gas has a flow from about 0.1 slm to about 1.0 slm. In a preferred embodiment, the nitridation process is a DPN process and includes a plasma by co-flowing Ar and $N_2$.

In another embodiment, instead of transferring the substrate to the DPN chamber, a nitridation process may include exposing the silicon oxide layer 220 to nitrogen plasma during each ALD half reaction, at the completion of an ALD cycle and/or at the completion of the deposition of a silicon oxide layer 220. For example, a nitridizing remote-plasma is exposed to silicon oxide layer 220 to form nitrogen-containing silicon oxide layer 230 directly in the ALD process chamber. Radical nitrogen compounds may also be produced by heat or hot-wires and used during nitridation processes. Other nitridation processes to form nitrogen-containing silicon oxide layer 230 are contemplated, such as annealing the substrate in a nitrogen-containing environment, and/or including a nitrogen precursor into an additional half reaction within the ALD cycle while forming the nitrogen-containing silicon oxide layer 230. For example, an additional half reaction during an ALD cycle to form silicon oxide may include a pulse of $NH_3$ followed by a pulse of purge gas.

Figure 2E:
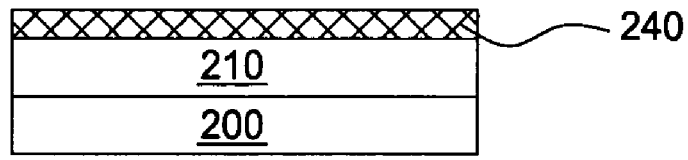

The substrate is subsequently transferred to an anneal chamber, such as the CENTURA™ RADIANCE™ RTP chamber available from Applied Materials, Inc., located in Santa Clara, Calif., and exposed to an anneal process. The anneal chamber may be on the same cluster tool as the deposition chamber and/or the nitridation chamber. Therefore, the substrate may be annealed without being exposed to the ambient environment. FIG. 1, step 108, the substrate is annealed converting nitrogen-containing silicon oxide layer 230 to a capping layer 240, such as silicon oxynitride ($SiO_xN_y$), as depicted in FIG. 2E. The substrate is maintained at a temperature from about 600° C. to about 1,200° C., preferably from about 800° C. to about 1,100° C. for a time period from about 1 second to about 120 seconds, preferably from about 30 seconds to about 90 seconds, for example, at about 1,000° C. for about 60 seconds. Generally, the anneal chamber atmosphere contains at least one anneal gas, such as $O_2$, $N_2$, $NH_3$, $N_2H_4$, NO, $N_2O$, or combinations thereof. The anneal chamber is maintained at a pressure from about 5 Torr to about 100 Torr, for example, at about 15 Torr. The nitrogen atoms within the nitrogen-containing silicon oxide layer 230 are chemically incorporated into capping layer 240.

Figure 2F:
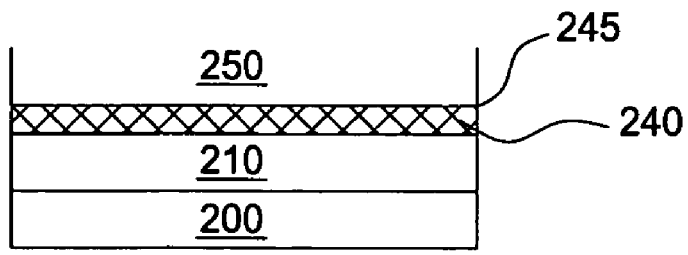

Once the capping layer 240 is formed, additional materials are deposited thereon, during step 110, such as a polysilicon layer 250, as shown in FIG. 2F. Polysilicon layer 250 may be deposited by CVD, atomic layer epitaxy (ALE), thermal decomposition methods, or similar deposition techniques known in the art. Polysilicon layer 250 generally contains dopants, such as boron, phosphorus, or arsenic. Capping layer 240 maintains a dopant barrier at interface 245 between dielectric layer 210 and polysilicon layer 250, thus the mobility of charge carriers in a boron-doped, polysilicon layer 250 is enhanced.

Hardware

Figure 4:
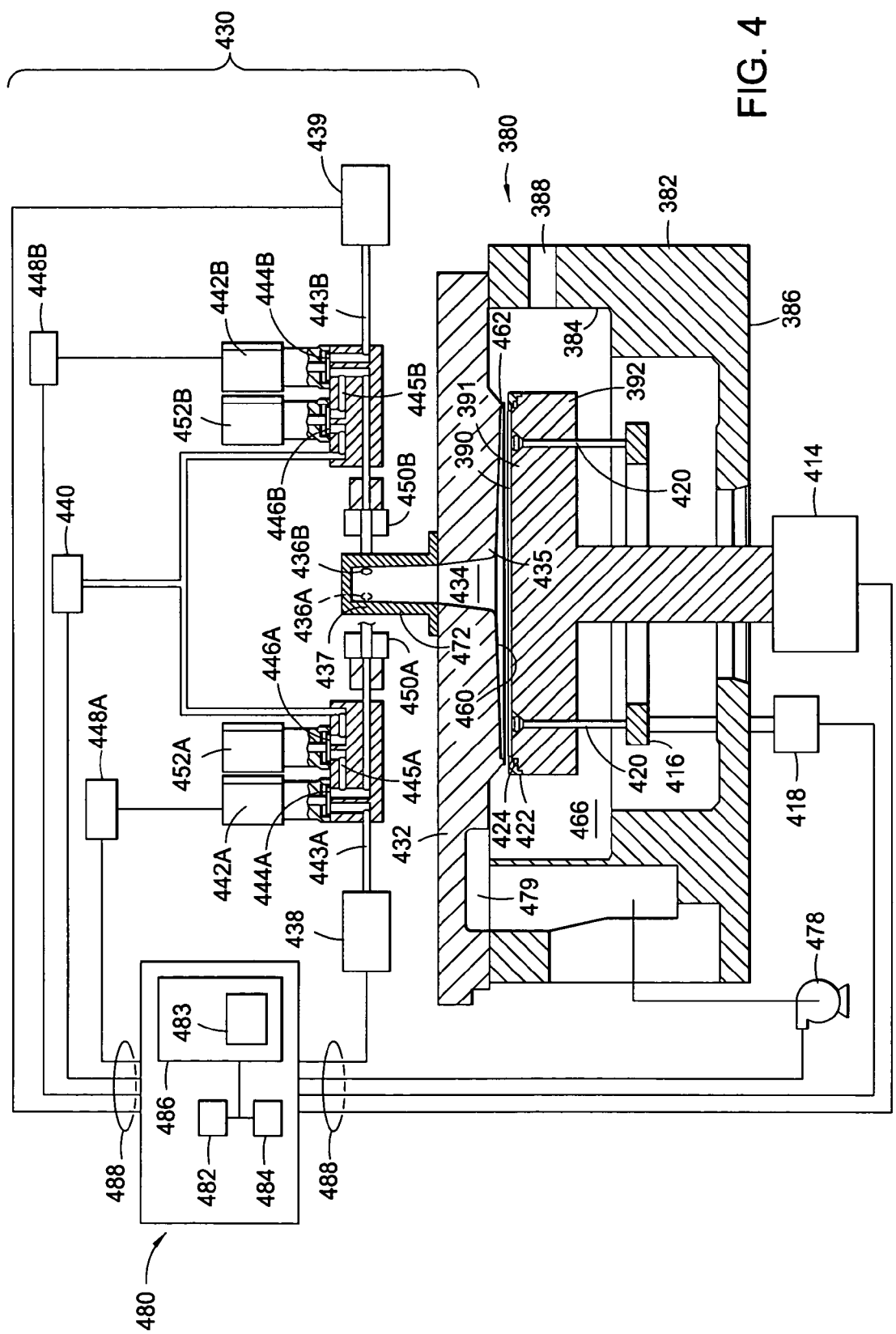
FIG. 4 depicts a schematic cross-sectional view of a process chamber that may be used to perform an ALD process described herein.

FIG. 4 is a schematic cross-sectional view of one embodiment of a process chamber 380 including a gas delivery apparatus 430 adapted for cyclic deposition, such as atomic layer deposition or rapid chemical vapor deposition. A detailed description for a process chamber 380 is described in commonly assigned U.S. Patent Application Publication No. 20030079686 and commonly assigned U.S. Patent Application Publication No. 20030121608, which are both incorporated herein in their entirety by reference. Several alternative chambers for cyclic deposition are described in co-pending United States Provisional Patent Application Serial No. unknown, filed May 12, 2004, entitled, "Atomic Layer Deposition of Hafnium-containing High-K Materials," assigned to Applied Materials, Inc., and is herein incorporated by reference. The terms atomic layer deposition (ALD) and rapid chemical vapor deposition as used herein refer to the sequential introduction of reactants to deposit a thin layer over a substrate structure. The sequential introduction of reactants may be repeated to deposit a plurality of thin layers to form a conformal layer to a desired thickness. The process chamber 380 may also be adapted for other deposition techniques.

The process chamber 380 comprises a chamber body 382 having sidewalls 384 and a bottom 386. A slit valve 388 in the process chamber 380 provides access for a robot (not shown) to deliver and retrieve a substrate 390, such as a semiconductor wafer with a diameter of 200 mm or 300 mm or a glass substrate, from the process chamber 380.

A substrate support 392 supports the substrate 390 on a substrate receiving surface 391 in the process chamber 380. The substrate support 392 is mounted to a lift motor 414 to raise and lower the substrate support 392 and a substrate 390 disposed thereon. A lift plate 416 connected to a lift motor 418 is mounted in the process chamber 380 and raises and lowers pins 420 movably disposed through the substrate support 392. The pins 420 raise and lower the substrate 390 over the surface of the substrate support 392. The substrate support 392 may include a vacuum chuck, an electrostatic chuck, or a clamp ring for securing the substrate 390 to the substrate support 392 during processing.

The substrate support 392 may be heated to increase the temperature of a substrate 390 disposed thereon. For example, the substrate support 392 may be heated using an embedded heating element, such as a resistive heater, or may be heated using radiant heat, such as heating lamps disposed above the substrate support 392. A purge ring 422 may be disposed on the substrate support 392 to define a purge channel 424 which provides a purge gas to a peripheral portion of the substrate 390 to prevent deposition thereon.

A gas delivery apparatus 430 is disposed at an upper portion of the chamber body 382 to provide a gas, such as a process gas and/or a purge gas, to the process chamber 380. A vacuum system 478 is in communication with a pumping channel 479 to evacuate any desired gases from the process chamber 380 and to help maintain a desired pressure or a desired pressure range inside a pumping zone 466 of the process chamber 380.

In one embodiment, the chamber depicted by FIG. 4 permits the process gas and/or purge gas to enter the process chamber 380 normal (i.e., 90°) with respect to the plane of the substrate 390 via the gas delivery apparatus 430. Therefore, the surface of substrate 390 is symmetrically exposed to gases that allow uniform film formation on substrates. The process gas includes a silicon precursor (e.g., TDMAS) during one pulse and includes an oxidizing gas (e.g., water vapor) in another pulse.

In one embodiment, the gas delivery apparatus 430 comprises a chamber lid 432. The chamber lid 432 includes an expanding channel 434 extending from a central portion of the chamber lid 432 and a bottom surface 460 extending from the expanding channel 434 to a peripheral portion of the chamber lid 432. The bottom surface 460 is sized and shaped to substantially cover a substrate 390 disposed on the substrate support 392. The chamber lid 432 may have a choke 462 at a peripheral portion of the chamber lid 432 adjacent the periphery of the substrate 390. The cap portion 472 includes a portion of the expanding channel 434 and gas inlets 436A, 436B. The expanding channel 434 has gas inlets 436A, 436B to provide gas flows from two similar valves 442A, 442B. The gas flows from the valves 442A, 442B may be provided together and/or separately.

In one configuration, valve 442A and valve 442B are coupled to separate reactant gas sources but are preferably coupled to the same purge gas source. For example, valve 442A is coupled to reactant gas source 438 and valve 442B is coupled to reactant gas source 439, and both valves 442A, 442B are coupled to purge gas source 440. Each valve 442A, 442B includes a delivery line 443A, 443B having a valve seat assembly 444A, 444B and includes a purge line 445A, 445B having a valve seat assembly 446A, 446B in fluid with valves 452A, 452B. The delivery line 443A, 443B is in communication with the reactant gas source 438, 439 and is in communication with the gas inlet 436A, 436B of the expanding channel 434. Additional reactant gas sources (e.g., WVG system output), delivery lines, gas inlets and valves may be added to the gas delivery apparatus 430 in one embodiment (not shown). The valve seat assembly 444A, 444B of the delivery line 443A, 443B controls the flow of the reactant gas from the reactant gas source 438, 439 to the expanding channel 434. The purge line 445A, 445B is in communication with the purge gas source 440 and intersects the delivery line 443A, 443B downstream of the valve seat assembly 444A, 444B of the delivery line 443A, 443B. The valve seat assembly 446A, 446B of the purge line 445A, 445B controls the flow of the purge gas from the purge gas source 440 to the delivery line 443A, 443B. If a carrier gas is used to deliver reactant gases from the reactant gas source 438, 439, preferably the same gas is used as a carrier gas and a purge gas (e.g., nitrogen used as a carrier gas and a purge gas).

Each valve seat assembly 444A, 444B, 446A, 446B may comprise a diaphragm and a valve seat. The diaphragm may be biased open or closed and may be actuated closed or open respectively. The diaphragms may be pneumatically actuated or may be electrically actuated. Examples of pneumatically actuated valves include pneumatically actuated valves available from Fujikin and Veriflow. Examples of electrically actuated valves include electrically actuated valves available from Fujikin. Programmable logic controllers 448A, 448B may be coupled to the valves 442A, 442B to control actuation of the diaphragms of the valve seat assemblies 444A, 444B, 446A, 446B of the valves 442A, 442B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 442A, 442B may be a zero dead volume valve to enable flushing of a reactant gas from the delivery line 443A, 443B when the valve seat assembly 444A, 444B of the valve is closed. For example, the purge line 445A, 445B may be positioned adjacent the valve seat assembly 444A, 444B of the delivery line 443A, 443B. When the valve seat assembly 444A, 444B is closed, the purge line 445A, 445B may provide a purge gas to flush the delivery line 443A, 443B. In the embodiment shown, the purge line 445A, 445B is positioned slightly spaced from the valve seat assembly 444A, 444B of the delivery line 443A, 443B so that a purge gas is not directly delivered into the valve seat assembly 444A, 444B when open. A zero dead volume valve as used herein is defined as a valve which has negligible dead volume (i.e., not necessary zero dead volume.)

Each valve 442A, 442B may be adapted to provide a combined gas flow and/or separate gas flows of the reactant gas 438, 439 and the purge gas 440. In reference to valve 442A, one example of a combined gas flow of the reactant gas 438 and the purge gas 440 provided by valve 442A comprises a continuous flow of a purge gas from the purge gas source 440 through purge line 445A and pulses of a reactant gas from the reactant gas source 438 through delivery line 443A. The continuous flow of the purge gas may be provided by leaving diaphragm of the valve seat assembly 446A of the purge line 445A open. The pulses of the reactant gas from the reactant gas source 438 may be provided by opening and closing the diaphragm of the valve seat 444A of the delivery line 443A. In reference to valve 442A, one example of separate gas flows of the reactant gas 438 and the purge gas 440 provided by valve 442A comprises pulses of a purge gas from the purge gas source 440 through purge line 445A and pulses of a reactant gas from the reactant gas source 438 through delivery line 443A. The pulses of the purge gas may be provided by opening and closing the diaphragm of the valve seat assembly 446A of the purge line 445A open. The pulses of the reactant gas from the reactant gas source 438 may be provided by opening and closing the diaphragm valve seat 444A of the delivery line 443A.

The delivery lines 443A, 443B of the valves 442A, 442B may be coupled to the gas inlets 436A, 436B through gas conduits 450A, 450B. The gas conduits 450A, 450B may be integrated or may be separate from the valves 442A, 442B. In one aspect, the valves 442A, 442B are coupled in close proximity to the expanding channel 434 to reduce any unnecessary volume of the delivery line 443A, 443B and the gas conduits 450A, 450B between the valves 442A, 442B and the gas inlets 436A, 436B.

In FIG. 4, the expanding channel 434 comprises a channel which has an inner diameter which increases from an upper portion 437 to a lower portion 435 of the expanding channel 434 adjacent the bottom surface 460 of the chamber lid 432.

In one specific embodiment, the inner diameter of the expanding channel 434 for a chamber adapted to process 200 mm diameter substrates is between about 0.2 inches (0.51 cm) and about 1.0 inches (2.54 cm), preferably between about 0.3 inches (0.76 cm) and about 0.9 inches (2.29 cm) and more preferably between about 0.3 inches (0.76 cm) and about 0.5 inches (1.27 cm) at the upper portion 437 of the expanding channel 434 and between about 0.5 inches (1.27 cm) and about 3.0 inches (7.62 cm), preferably between about 0.75 inches (1.91 cm) and about 2.5 inches (6.35 cm) and more preferably between about 1.1 inches (2.79 cm) and about 2.0 inches (5.08 cm) at the lower portion 435 of the expanding channel 434.

In another specific embodiment, the inner diameter of the expanding channel 434 for a chamber adapted to process 300 mm diameter substrates is between about 0.2 inches (0.51 cm) and about 1.0 inches (2.54 cm), preferably between about 0.3 inches (0.76 cm) and about 0.9 inches (2.29 cm) and more preferably between about 0.3 inches (0.76 cm) and about 0.5 inches (1.27 cm) at the upper portion 437 of the expanding channel 434 and between about 0.5 inches (1.27 cm) and about 3.0 inches (7.62 cm), preferably between about 0.75 inches (1.91 cm) and about 2.5 inches (6.35 cm) and more preferably between about 1.2 inches (3.05 cm) and about 2.2 inches (5.59 cm) at the lower portion 435 of the expanding channel 434 for a 300 mm substrate. In general, the above dimension apply to an expanding channel adapted to provide a total gas flow of between about 500 sccm and about 3,000 sccm.

In other specific embodiments, the dimension may be altered to accommodate a certain gas flow therethrough. In general, a larger gas flow will require a larger diameter expanding channel. In one embodiment, the expanding channel 434 may be shaped as a truncated cone (including shapes resembling a truncated cone). Whether a gas is provided toward the walls of the expanding channel 434 or directly downward towards the substrate, the velocity of the gas flow decreases as the gas flow travels through the expanding channel 434 due to the expansion of the gas. The reduction of the velocity of the gas flow helps reduce the likelihood the gas flow will blow off reactants adsorbed on the surface of the substrate 390.

Not wishing to be bound by theory, it is believed that the diameter of the expanding channel 434, which is gradually increasing from the upper portion 437 to the lower portion 435 of the expanding channel, allows less of an adiabatic expansion of a gas through the expanding channel 434 which helps to control the temperature of the gas. For instance, a sudden adiabatic expansion of a gas delivered through the gas inlet 436A, 436B into the expanding channel 434 may result in a drop in the temperature of the gas which may cause condensation of the precursor vapor and formation of particles. On the other hand, a gradually expanding channel 434 according to embodiments of the present invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of the chamber lid 432). The gradually expanding channel may comprise one or more tapered inner surfaces, such as a tapered straight surface, a concave surface, a convex surface, or combinations thereof or may comprise sections of one or more tapered inner surfaces (i.e., a portion tapered and a portion non-tapered).

In one embodiment, the gas inlets 436A, 436B are located adjacent the upper portion 437 of the expanding channel 434. In other embodiments, one or more gas inlets may be located along the length of the expanding channel 434 between the upper portion 437 and the lower portion 435.

In FIG. 4, a control unit 480, such as a programmed personal computer, work station computer, or the like, may be coupled to the process chamber 380 to control processing conditions. For example, the control unit 480 may be configured to control flow of various process gases and purge gases from gas sources 438, 439, 440 through the valves 442A, 442B during different stages of a substrate process sequence. Illustratively, the control unit 480 comprises a central processing unit (CPU) 482, support circuitry 484, and memory 486 containing associated control software 483.

The control unit 480 may be one of any form of general purpose computer processor that can be used in an industrial setting for controlling various chambers and sub-processors. The CPU 482 may use any suitable memory 486, such as random access memory, read only memory, floppy disk drive, compact disc drive, hard disk, or any other form of digital storage, local or remote. Various support circuits may be coupled to the CPU 482 for supporting the process chamber 380. The control unit 480 may be coupled to another controller that is located adjacent individual chamber components, such as the programmable logic controllers 448A, 448B of the valves 442A, 442B. Bi-directional communications between the control unit 480 and various other components of the process chamber 380 are handled through numerous signal cables collectively referred to as signal buses 488, some of which are illustrated in FIG. 4. In addition to control of process gases and purge gases from gas sources 438, 439, 440 and from the programmable logic controllers 448A, 448B of the valves 442A, 442B, the control unit 480 may be configured to be responsible for automated control of other activities used in wafer processing, such as wafer transport, temperature control, chamber evacuation, among other activities, some of which are described elsewhere herein.

EXAMPLES

The ALD processes are maintained in a temperature range from about 70° C. to about 1,000° C., preferably from about 100° C. to about 400° C., for example, about 250° C. Materials grown may be similar throughout a wider temperature range assuming that saturating ALD behavior is maintained. The ALD processes are conducted with a pressure in the range from about 0.1 Torr to about 100 Torr, preferably in the range from about 1 Torr to about 10 Torr. Materials grown may be similar from high vacuum to high pressures assuming saturating ALD behavior is maintained. The flow is maintained viscous to encourage reactant separation. Carrier gas (e.g., $N_2$ or Ar) is maintained in the range from about 2 slm to about 22 slm, preferably at about 10 slm.

Example 1

A silicon-containing capping layer is formed on a high-k gate dielectric. Initially, a substrate is placed in to an ALD chamber and the substrate surface is exposed to a pretreatment of water vapor to form hydroxyl groups. A hafnium silicate layer is deposited to the substrate surface by performing an ALD process using the hafnium precursor (TDEAH), the silicon precursor (TDMAS), and in-situ water vapor produced by a water vapor generator (WVG) system, available from Fujikin of America, Inc., located in Santa Clara, Calif. The ALD cycle includes sequentially pulsing TDEAH, water vapor, TDMAS and water vapor, with each precursor separated by a nitrogen purge. The hafnium silicate layer is formed by repeating the cycle until the film has a thickness of about 100 Å.

Next, the silicon-containing capping layer is formed on the hafnium silicate layer in the same ALD chamber. Silicon oxide is grown with an ALD process by sequentially pulsing a silicon precursor (TDMAS) with in-situ water vapor formed from a WVG system. Carrier gas, such as nitrogen, is directed into the ALD process chamber with a flow rate of about 2 slm. The TDMAS is dosed into the carrier gas and pulsed into the chamber for about 1 second. A purge gas of nitrogen is pulsed into the chamber for 1.5 seconds to remove any unbound TDMAS. Hydrogen gas and oxygen gas with the flow rate of 100 sccm and 80 sccm respectively, are supplied the WVG system. The in-situ water vapor exits from the WVG system with approximately 100 sccm of water and about 30 sccm of oxygen. The in-situ water vapor is pulsed into the chamber for 1.7 seconds. The purge gas of nitrogen is pulsed into the chamber for 1.5 seconds to remove any unbound or non-reacted reagents. The ALD cycle is repeated 8 times to produce a silicon oxide layer with a thickness of about 5 Å.

The substrate is transferred to a decoupled plasma nitridation (DPN) chamber, such as the CENTURA™ DPN chamber, available from Applied Materials, Inc., located in Santa Clara, Calif. The substrate surface is exposed to a nitridation process by co-flowing $N_2$ with an argon plasma. The nitridation process proceeds for about 30 seconds to incorporate nitrogen atoms within the silicon oxide layer. The substrate is subsequently transferred to an anneal chamber, such as the CENTURA™ RADIANCE™ RTP chamber available from Applied Materials, Inc., located in Santa Clara, Calif. and exposed to an anneal process. The substrate is maintained at about 1,000° C. for about 1 minute in an $O_2$ atmosphere maintained at about 15 Torr. The incorporated nitrogen atoms form bonds with the silicon oxide to produce silicon oxynitride.

Example 2

A silicon-containing capping layer is formed on a high-k gate dielectric. Initially, a substrate is placed in to an ALD chamber equipped with a remote plasma generator and the substrate surface is exposed to a pretreatment of water vapor to form hydroxyl groups. A hafnium silicate layer is deposited to the substrate surface by performing an ALD process using the hafnium precursor ($HfCl_4$), the silicon precursor (Tris- DMAS), and in-situ water vapor produced by a WVG system. The ALD cycle includes sequentially pulsing $HfCl_4$, water vapor, Tris-DMAS and water vapor, with each precursor separated by an argon purge. The hafnium silicate layer is formed by repeating the cycle until the film has a thickness of about 50 Å, subsequently, the ALD cycle is altered. The hafnium precursor pulses and one of the water vapor pulses are stopped. Therefore, the ALD cycle, forming silicon oxide instead of hafnium silicate, includes continuing sequential pulsing of Tris-DMAS and water vapor formed by the WVG system. Carrier gas, such as argon, is directed into the ALD process chamber with a flow rate of about 2 slm. The Tris-DMAS is dosed into the carrier gas and pulsed into the chamber for about 1 second. A purge gas of argon is pulsed into the chamber for 1.5 seconds to remove any unbound Tris-DMAS. Hydrogen gas and oxygen gas with the flow rate of 100 sccm and 80 sccm respectively, are supplied the WVG system. The in-situ water vapor exits from the WVG system with approximately 100 sccm of water and about 30 sccm of oxygen. The in-situ water vapor is pulsed into the chamber for 1.7 seconds. The argon purge gas is pulsed into the chamber for 1.5 seconds to remove any unbound or non-reacted reagents. The ALD cycle is repeated 8 times to produce a silicon oxide layer with a thickness of about 5 Å.

The substrate is kept in the same ALD chamber equipped with a remote plasma generator. The substrate surface is exposed to a remote plasma nitridation process for about 30 seconds to incorporate nitrogen atoms within the silicon oxide layer. The substrate is subsequently transferred to an anneal chamber, such as the CENTURA™ RADIANCE™ RTP chamber available from Applied Materials, Inc., located in Santa Clara, Calif. and exposed to an anneal process. The substrate is maintained at about 1,000° C. for about 1 minute in an $O_2$ atmosphere maintained at about 15 Torr. The incorporated nitrogen atoms form bonds with the silicon oxide to produce silicon oxynitride.

While the foregoing is directed to embodiments of the present invention, other and further embodiments of the invention may be devised without departing from the basic scope thereof, and the scope thereof is determined by the claims that follow.

The invention claimed is:

1. A method for depositing a capping layer on a dielectric layer, comprising:
depositing the dielectric layer on a substrate by a first ALD process from a first group of gases, depositing the dielectric layer composing alternately pulsing a high-k precursor and a water formed oxidizing gas to the substrate surface, wherein the dielectric layer is a high-k layer;
depositing a silicon-containing layer on the dielectric layer by an second ALD process from a second group of gases, depositing the silicon-containing layer comprising alternately pulsing a silicon precursor and an oxidizing gas into a process chamber, wherein the oxidizing gas comprises water formed by flowing a hydrogen-containing gas and an oxygen-containing gas through a catalytic water vapor generator;
exposing the silicon-containing layer to a nitridation process; and
exposing the substrate to a anneal process.

2. The method of claim 1, wherein the nitridation process comprises a nitrogen plasma.

3. The method of claim 2, wherein the anneal process is at a temperature within a range from about 600° C. to about 1,200° C. for a time period within a range from about 1 second to about 120 seconds.

4. The method of claim 3, wherein the silicon-containing layer is about 5 Å or less.

5. The method of claim 1, wherein the dielectric layer comprises a material selected from the group consisting of hafnium oxide, hafnium silicate, hafnium silicon oxynitride, hafnium aluminum oxynitride, aluminum oxide, laminate of hafnium oxide and aluminum oxide, lanthanum aluminum oxide, lanthanum oxide, derivatives thereof, and combinations thereof.

6. The method of claim 5, wherein the depositing the dielectric layer, the depositing the silicon-containing layer, and the nitridation process occur in the same process chamber.

7. The method of claim 5, wherein the catalytic water vapor generator comprises a catalyst-lined reactor or a catalyst cartridge.

8. The method of claim 7, wherein the oxygen-containing gas comprises at least one gas selected from the group consisting of $O_2$, $N_2O$, $NO_2$, $N_2O_5$ and combinations thereof.

9. The method of claim 8, wherein the silicon precursor is selected from the group consisting of $(Me_2N)_4Si$, $(Me_2N)_3SiH$, $(Et_2N)_4Si$, $(Et_2N)_3SiH$, $(MeEtN)_4Si$, $(MeEtN)_3SiH$, $SiH_4$, $SiCl_4$, $H_2SiCl_2$, $Si_2H_6$, $Si_2Cl_6$, derivatives thereof, and combinations thereof.

10. A method for depositing a capping layer on a dielectric layer in a process chamber, comprising:
depositing the dielectric layer on a substrate by a first ALD process, wherein the dielectric layer is a high-k layer formed by alternately pulsing a high-k precursor and a water formed oxidizing gas to the substrate surface through a catalytic water vapor generator;
exposing the dielectric layer to a second ALD process from a second group of gases, comprising alternately pulsing a silicon precursor and an oxidizing gas into the process chamber, wherein the oxidizing gas comprises water formed by flowing a hydrogen-containing gas and an oxygen-containing gas through the catalytic water vapor generator, the second ALD process depositing a silicon-containing layer on the dielectric layer; and
exposing the silicon-containing layer to a nitridation process.

11. The method of claim 10, wherein the catalytic water vapor generator comprises a catalyst-lined reactor or a catalyst cartridge.

12. The method of claim 11, wherein the oxygen-containing gas comprises at least one gas selected from the group consisting of $O_2$, $N_2O$, $NO_2$, $N_2O_5$ and combinations thereof.

13. The method of claim 12, wherein the silicon precursor is selected from the group consisting of $(Me_2N)_4Si$, $(Me_2N)_3SiH$, $(Et_2N)_4Si$, $(Et_2N)_3SiH$, $(MeEtN)_4Si$, $(MeEtN)_3SiH$, $SiH_4$, $SiCl_4$, $H_2SiCl_2$, $Si_2H_6$, $Si_2Cl_6$, derivatives thereof and combinations thereof.

14. The method of claim 10, wherein the nitridation process comprises a nitrogen plasma.

15. The method of claim 14, wherein the substrate is annealed for a time period within a range from about 1 second to about 120 seconds and at a temperature from about 600° C. to about 1,200° C.

16. The method of claim 14, wherein a polysilicon layer is deposited to the capping layer.

17. The method of claim 15, wherein the silicon-containing layer is about 5 Å or less.

18. The method of claim 17, wherein the dielectric layer is selected from the group consisting of hafnium oxide, hafnium silicate, hafnium silicon oxynitride, hafnium aluminum oxynitride, aluminum oxide, laminate of hafnium oxide and aluminum oxide, lanthanum aluminum oxide, lanthanum oxide, derivatives thereof, and combinations thereof.

19. The method of claim 10, wherein the depositing the dielectric layer, the depositing the silicon-containing layer and the nitridation process occur in the processing chamber.

20. A method for depositing a silicon-containing capping layer on a dielectric layer in a process chamber by an ALD process, comprising:
    providing a substrate having a dielectric layer disposed thereon into an ALD process chamber, wherein the dielectric layer is a hafnium oxide containing layer formed from a first ALD process from a first group of gases by alternation pulsing a hafnium containing precursor and water formed oxidizing gas; and
    performing a second ALD process comprising:
        flowing a second group of gases comprising a silicon precursor into the ALD process chamber;
        purging the process chamber with a purge gas;
        flowing an oxidizing gas into the process chamber to form a silicon-containing capping layer, the oxidizing gas comprising hydrogen enriched water formed by flowing a hydrogen-containing gas and a oxygen-containing gas through a catalytic water vapor generator; and
        purging the process chamber with the purge gas.

21. The method of claim 20, wherein the oxygen-containing gas comprises at least one gas selected from the group consisting of $O_2$, $N_2O$, $NO_2$, $N_2O_5$ and combinations thereof.

22. The method of claim 21, wherein the silicon-containing capping layer is exposed to a plasma nitridation process.

23. The method of claim 22, wherein the silicon-containing capping layer is annealed at a temperature from about 600° C. to about 1,200° C. for a time period within a range form about 1 second to about 120 seconds.

24. The method of claim 21, wherein the silicon precursor is selected from the group consisting of $(Me_2N)_4Si$, $(Me_2N)_3SiH$, $(Et_2N)_4Si$, $(Et_2N)_3SiH$, $(MeEtN)_4Si$, $(MeEtN)_3SiH$, $SiH_4$, $SiCl_4$, $H_2SiCl_2$, $Si_2H_6$, $Si_2Cl_6$, derivatives thereof and combinations thereof.

25. The method of claim 24, wherein a polysilicon layer is deposited to the silicon-containing capping layer.

26. The method of claim 24, wherein the silicon-containing capping layer is about 5 Å or less.

27. The method of claim 26, wherein the dielectric layer comprises a material selected from the group consisting of hafnium oxide, hafnium silicate, hafnium silicon oxynitride, hafnium aluminum oxynitride, aluminum oxide, laminate of hafnium oxide and aluminum oxide, lanthanum aluminum oxide, lanthanum oxide, derivatives thereof, and combinations thereof.

28. A method for depositing a silicon-containing layer on a substrate surface in a process chamber, comprising:
    exposing the substrate having a hafnium containing dielectric layer formed from a first ALD process from a first gas mixture by alternately pulsing a hafnium containing precursor and water formed oxidizing gas to a second gas mixture comprising a silicon precursor and an oxidizing gas during a second ALD process to form a silicon oxide layer on the hafnium containing dielectric layer, wherein the oxygen-containing gas through a water vapor generator; and
    exposing the silicon oxide layer to a nitridation process.

29. The method of claim 28, wherein the oxygen-containing gas comprises at least one gas selected from the group consisting of $O_2$, $N_2O$, $NO_2$, $N_2O_5$ and combinations thereof.

30. The method of claim 29, wherein the nitridation process comprises a nitrogen plasma.

31. The method of claim 30, wherein the silicon-containing layer is annealed at a temperature from about 600° C. to about 1,200° C. for a time period from about 1 second to about 120 seconds.

32. The method of claim 30, wherein the silicon precursor is selected from the group consisting of $(Me_2N)_4Si$; $(Me_2N)_3SiH$, $(Et_2N)_4Si$, $(Et_2N)_3SiH$, $(MeEtN)_4Si$, $(MeEtN)_3SiH$, $SiH_4$, $SiCl_4$, $H_2SiCl_2$, $Si_2H_6$, $Si_2Cl_6$, derivatives thereof and combinations thereof.

33. The method of claim 32, wherein a polysilicon layer is deposited on the silicon layer.

34. The method of claim 32, wherein the silicon oxide layer has a thickness of about 5 Å or less.

35. The method of claim 34, wherein the dielectric layer comprises a material selected from the group consisting of hafnium oxide, hafnium silicate, hafnium silicon oxynitride, hafnium aluminum oxynitride, laminate of hafnium oxide and aluminum oxide, lanthanum aluminum oxide, lanthanum oxide, aluminum oxide, derivatives thereof, and combinations thereof.

36. The method of claim 1, wherein the catalytic water vapor generator comprises a catalyst material selected from the group consisting of palladium, platinum, nickel alloys thereof, and combinations thereof.

37. The method of claim 36, wherein the oxidizing gas comprises an oxygen enriched water vapor.

38. The method of claim 36, wherein the oxidizing gas comprises a hydrogen enriched water vapor.

39. The method of claim 10, wherein the catalytic water vapor generator comprises a catalyst material selected from the group consisting of palladium, platinum, nickel, alloys thereof, and combinations thereof.

40. The method of claim 39, wherein the oxidizing gas comprises an oxygen enriched water vapor.

41. The method of claim 39, wherein the oxidizing gas comprises a hydrogen enriched water vapor.

42. The method of claim 20, wherein the catalytic water vapor generator comprises a catalyst material selected from the group consisting of palladium, platinum, nickel alloys thereof, and combinations thereof.

43. The method of claim 28, wherein the catalytic water vapor generator comprises a catalyst material selected from the group consisting of palladium, platinum, nickel alloys thereof, and combinations thereof.

44. The method of claim 43, wherein the oxidizing gas comprises an oxygen enriched water vapor.

45. The method of claim 43, wherein the oxidizing gas comprises a hydrogen enriched water vapor.

* * * * *

UNITED STATES PATENT AND TRADEMARK OFFICE
CERTIFICATE OF CORRECTION

PATENT NO.         : 8,119,210 B2
APPLICATION NO.    : 10/851561
DATED              : February 21, 2012
INVENTOR(S)        : Narwankar et al.

It is certified that error appears in the above-identified patent and that said Letters Patent is hereby corrected as shown below:

In the Claims:

Column 15, Claim 1, Line 46, please delete "the" and insert --a-- therefor;

Column 15, Claim 1, Line 48, please delete "composing" and insert --comprising-- therefor;

Column 15, Claim 1, Line 61, please delete "a" and insert --an-- therefor;

Column 16, Claim 4, Line 2, please delete "is" and insert --has a thickness of-- therefor;

Column 16, Claim 10, Line 27, please delete "in" and insert --within-- therefor;

Column 16, Claim 10, Line 28, please delete "the" and insert --a-- therefor;

Column 16, Claim 15, Line 58, please insert --within a range-- after temperature;

Column 16, Claim 16, Line 61, please delete "to" and insert --on-- therefor;

Column 16, Claim 17, Line 63, please delete "is" and insert --has a thickness of-- therefor;

Column 16, Claim 18, Line 64, please delete "is" and insert --comprises a material-- therefor;

Column 17, Claim 20, Line 13, please delete "alternation" and insert --alternating-- therefor;

Column 17, Claim 20, Line 14, please insert --a-- before water;

Column 17, Claim 20, Line 22, please delete "a" before oxygen-containing and insert --an-- therefor;

Column 17, Claim 23, Line 32, please insert --within a range-- after temperature;

Column 17, Claim 23, Line 33, please delete "form" and insert --from-- therefor;

Column 17, Claim 25, Line 41, please delete "to" and insert --on-- therefor;

Column 17, Claim 26, Line 43, please delete "is" and insert --has a thickness of-- therefor;

Column 17, Claim 27, Lines 48-49, please delete "lanthanum aluminum oxide, lanthanum oxide,";

Column 17, Claim 28, Line 53, please delete "the" and insert --a-- therefor;

Column 18, Claim 28, Line 2, please insert --oxidizing gas comprising water formed by flowing a hydrogen-containing gas and an-- after wherein the;

Column 18, Claim 31, Line 10, please delete "silicon-containing" and insert --silicon oxide-- therefor;

Signed and Sealed this
Seventeenth Day of July, 2012

David J. Kappos
*Director of the United States Patent and Trademark Office*

CERTIFICATE OF CORRECTION (continued)
U.S. Pat. No. 8,119,210 B2

Column 18, Claim 31, Line 11, please insert --within a range-- after temperature;

Column 18, Claim 31, Line 12, please insert --within a range-- after period;

Column 18, Claim 33, Line 20, please insert --oxide-- after silicon;

Column 18, Claim 35, Lines 27-28, please delete "lanthanum aluminum oxide, lanthanum oxide, aluminum oxide,";

Column 18, Claim 36, Line 32, please insert --,-- after nickel;

Column 18, Claim 42, Line 48, please insert --,-- after nickel;

Column 18, Claim 43, Line 52, please insert --,-- after nickel.